(12) United States Patent
Ota et al.

(10) Patent No.: US 8,021,932 B2
(45) Date of Patent: Sep. 20, 2011

(54) SEMICONDUCTOR DEVICE, AND MANUFACTURING METHOD THEREFOR

(75) Inventors: Yusuke Ota, Tokyo (JP); Michiaki Sugiyama, Tokyo (JP); Toshikazu Ishikawa, Tokyo (JP); Mikako Okada, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 227 days.

(21) Appl. No.: 12/430,277

(22) Filed: Apr. 27, 2009

(65) Prior Publication Data
US 2009/0294978 A1 Dec. 3, 2009

(30) Foreign Application Priority Data

May 29, 2008 (JP) ................................ 2008-141285

(51) Int. Cl.
*H01L 21/00* (2006.01)
(52) U.S. Cl. ........ 438/125; 257/777; 257/778; 257/779; 257/E23.06; 257/E21.502
(58) Field of Classification Search .................. 438/125; 257/737, 777, 778, 779, 780, 773, E23.06, 257/E21.502
See application file for complete search history.

(56) References Cited

U.S. PATENT DOCUMENTS

| 6,700,208 B1 | 3/2004 | Yoneda |
| 7,432,602 B2 | 10/2008 | Kuramochi |
| 2005/0093152 A1* | 5/2005 | Fjelstad et al. ................ 257/738 |

FOREIGN PATENT DOCUMENTS

| JP | 2001-127198 A | 5/2001 |
| JP | 2005-175113 A | 6/2005 |
| JP | 2007-59596 A | 3/2007 |

* cited by examiner

*Primary Examiner* — Zandra Smith
*Assistant Examiner* — Paul E Patton
(74) *Attorney, Agent, or Firm* — Mattingly & Malur, PC

(57) ABSTRACT

To provide a semiconductor device with improved reliability. The semiconductor device includes a wiring board, a microcomputer chip flip-chip bonded over the wiring board via gold bumps, a first memory chip laminated over the microcomputer chip, wires for coupling the first memory chip to the wiring board, an underfill material with which a flip-chip coupling portion of the microcomputer chip is filled, and a sealing member for sealing the microcomputer chip and the first memory chip with resin. Further, the corner of a second opening portion of a solder resist film of the wiring board corresponding to the corner of the chip on the air vent side in charging the underfill material is made close to the microcomputer chip, which can improve the wettability and spread of the underfill material at the second opening portion, thus reducing the exposure of leads to the second opening portion, thereby improving the reliability of the semiconductor device.

9 Claims, 18 Drawing Sheets

SEMICONDUCTOR DEVICE, AND MANUFACTURING METHOD THEREFOR

CROSS-REFERENCE TO RELATED APPLICATIONS

The disclosure of Japanese Patent Application No. 2008-141285 filed on May 29, 2008 including the specification, drawings and abstract is incorporated herein by reference in its entirety.

BACKGROUND OF THE INVENTION

The present invention relates to semiconductor devices, and manufacturing methods therefor, and more particularly, a semiconductor device assembled by filling a semiconductor chip flip-chip bonded with underfill material.

An element to be mounted on a substrate for surface mounting has a plurality of protruding electrodes arranged in a staggered manner. The substrate for surface mounting has a plurality of bonding pads formed on a substrate body and corresponding to the protruding electrodes. A structure is disclosed in which each of the bonding pads includes a pad portion having a predetermined uniform width, and a tip extending from the pad toward a next line of the bonding pad (see, for example, Patent Document 1).

Another structure is disclosed in which on a substrate for flip chip mounting, a distance d1 between each side of a contour of an IC chip and an edge of an opening portion of an insulating protective film of the IC chip is formed to be 0.2 to 0.5 mm, and a corner of the opening portion is widely opened locally (see, for example, Patent Document 2).

A further structure is disclosed in which on a substrate surface of a semiconductor device flip-chip bonded, a frame-like dam for restricting a range of outflow of underfill material encloses the entire periphery of a semiconductor chip with solder balls arranged as an external connection terminal for the chip outside the frame-like dam (see, for example, Patent Document 3). In a region between a corner of the semiconductor chip and a corner of the frame-like dam opposed thereto, engraving is performed in a solder-resist layer.

[Patent Document 1] Japanese Unexamined Patent Publication No. 2001-127198

[Patent Document 2] Japanese Unexamined Patent Publication No. 2005-175113

[Patent Document 3] Japanese Unexamined Patent Publication No. 2007-59596

SUMMARY OF THE INVENTION

Flip chip bonding for electrically coupling a pad of a semiconductor chip with an electrode of a substrate via a protruding electrode is known as one of techniques meeting requirements for size reduction of a semiconductor device. Protruding electrodes include solder bumps formed of solder material, and gold bumps and the like formed of a gold wire by stud bump bonding. The flip-chip bonding establishes electric coupling with the substrate in a plane region of the semiconductor chip. Thus, the flip-chip bonding does not need an area for providing the gold wire, and thus is a very effective technique for size reduction of the semiconductor device, as compared to wire bonding which involves coupling a chip with a substrate using a gold wire.

As semiconductor devices have recently become more sophisticated in functionality, the number of pads on the semiconductor chip also intends to be increased. As one of techniques for increasing the number of pads on the semiconductor chip, not linear arrangement of pads, but alternate arrangement of pads by changing the respective lines for the pads (hereinafter referred to as "staggered arrangement") is known. The staggered arrangement is provided by displacing two lines of pads linearly arranged by one pad in the direction of pad arrangement. In making the staggered arrangement of the pads on the semiconductor chip so as to perform the flip-chip bonding, bonding leads for flip-chip bonding of the substrate serving as a carrier side of the pad are also formed in a staggered arrangement corresponding to the bonding pads as shown in FIG. 22 as a comparative example. At this time, since a pad pitch of the staggered arrangement on the chip side becomes small, bonding leads 7c on a wiring board 7 side are arranged in the staggered manner with a small pitch in the same way.

As a result, in an opening 7g of a solder resist film (insulating film) 7f of the wiring board 7, one end of each of the bonding leads 7c for flip-chip bonding arranged in the staggered manner, that is, a part over which the gold bump is mounted, is located in the opening 7g, and the other end thereof leads to a lead wire 7e to extend under the solder resist film 7f. This is the so-called cantilever lead form. In other words, for the bonding leads 7c in the staggered arrangement with the small pitch, it is difficult to provide a further lead wire 7e between the adjacent bonding leads 7c in the opening 7g of the solder resist film 7f of the wiring board 7 from the viewpoint of space. The other end of each bonding lead 7c is coupled to the lead wire 7e derived from each side of an inside of the opening 7g, and a mounting portion of the lead is ended near the center of the opening 7g.

In performing the flip-chip bonding via the gold bumps, it is effective to previously form solder (solder precoat) on the bonding lead 7c side for the flip-chip bonding of the wiring board 7. At this time, in order to maintain solder connection between the previous solder and the gold bump in a good state, a thick solder layer (solder precoat) 7r is preferably formed over the bonding lead 7c as shown in FIG. 23 of the comparative example.

Now, an example of a forming method for the solder layer (solder precoat) 7r over the bonding leads 7c disposed with a small pitch will be described below. An adhesive liquid coat is formed over copper material for forming the bonding lead 7c, and solder powder (solder particles) is applied to thereto. Then, flux is applied to the solder powder, and subjected to reflow soldering. The reflow soldering melts the solder powder to form the solder layer 7r on the lead. This method is effective in that it can uniformly form the solder layer 7r (solder precoat) on the leads even with the small pitch.

The solder forming method is applied to the bonding lead 7c of the cantilever lead form thereby to form the thick solder layer 7r on the bonding lead 7c. In this case, the solder powder attached to the lead wire 7e is collected on the bonding leads 7c by the reflow soldering thereby to form the thick solder layer 7r on the bonding leads 7c. Thus, an exposed portion of the lead wire 7e leading to the bonding lead 7c in the opening portion needs to be long so as to ensure the amount of solder required for bonding. In the bonding leads 7c of the cantilever lead form, the opening 7g of the solder resist film 7f needs to be widely formed to have a large width so as to ensure the long exposed portion of the lead wire 7e.

The inventors of the present application have considered filling with underfill material for the flip chip bonding using a substrate which includes an opening portion widely formed in a solder resist film, and bonding leads in a cantilever lead form formed in the staggered manner in the opening portion. As a result, the inventors have found the following new problems.

The filling with the underfill material after the flip-chip bonding involves dropping the underfill material into the opening portion of the solder resist film corresponding to the predetermined corner (on the injection side of the underfill material) of a semiconductor chip, and allowing the underfill material to penetrate through between the semiconductor chip and the substrate from the corner. The inventors have found a problem that application (wettability and spread) of the underfill material becomes insufficient near the respective opening portions of the corner on the injection side of the chip, and also of the corner on an air vent side of the chip disposed in the direction of a diagonal corner of the chip, which may cause a lead (lead wire) to be exposed.

Further, when the lead is exposed, the reliability of the semiconductor device may be degraded.

Patent Document 1 describes the bonding pads of the cantilever lead form, but fails to describe the problem of application (wettability and spread) of the underfill material. Patent Document 2 discloses the structure in which the opening portion of the insulating protective film (solder resist film) is widened at the corner. In this case, the application (wettability and spread) of the underfill material at the corner may be supposed to be degraded. Patent Document 3 discloses measures against overflow of the underfill material, but fails to describe the problem of application (wettability and spread) of the underfill material at the corner.

Thus, it is an object of the present invention to provide a technique which can improve the reliability of a semiconductor device.

The above, other objects and novel features of the invention will become apparent from the description of the present specification and the accompanying drawings.

The outline of representative aspects of the invention disclosed in the present application will be briefly described below.

That is, the invention provides a semiconductor device which comprises a substrate including a plurality of bonding leads, and having an insulating film formed over a surface thereof, the bonding leads being exposed to an opening of the insulating film; a semiconductor chip having a rectangular planar shape, and including a main surface with a plurality of pads formed thereover, and a back surface opposite to the main surface, the semiconductor chip being mounted over the surface of the substrate via protruding electrodes formed over the pads such that the main surface is opposed to the surface of the substrate; an underfill material with which a gap between the substrate and the semiconductor chip is filled; and a plurality of external terminals provided at the back surface of the substrate for coupling to an external portion. The opening of the insulating film of the substrate is formed along an outer peripheral shape of the semiconductor chip, and includes a first opening portion corresponding to a corner of the semiconductor chip, and a second opening portion opposed to the first opening portion. A plurality of through holes to be coupled to the external terminals are arranged outside the opening. The bonding lead includes a lead wire derived from the through hole into the opening, and a mounting portion over which the protruding electrode is mounted. The bonding lead derived in a direction from an outside of a side of the substrate into the opening, and the bonding lead derived in a direction from a center of the semiconductor chip into the opening are alternately arranged in the opening. The opening of the substrate is formed in a rectangular shape having a planar shape with four corners, the first opening portion has a first corner of the four corners, and the second opening portion has a second corner thereof. A distance between the second corner and a corner of the semiconductor chip adjacent thereto is shorter than that between the first corner and a corner of the semiconductor chip adjacent thereto.

Further, the invention provides a manufacturing method for a semiconductor device which comprises: (a) preparing a substrate including a plurality of bonding leads, and having an insulating film formed over a surface thereof, the bonding leads being exposed to an opening of the insulating film; (b) mounting a semiconductor chip having a rectangular planar shape, and including a main surface with a plurality of pads formed thereover, and a back surface opposite to the main surface, over the bonding leads of the substrate via protruding electrodes formed over the pads such that the main surface is opposed to the surface of the substrate; (c) filling a gap between the substrate and the semiconductor chip with underfill material; and (d) providing a plurality of external terminals at the back surface of the substrate for being coupled to an external portion. The opening of the insulating film of the substrate is formed along an outer peripheral shape of the semiconductor chip, and includes a first opening portion corresponding to a corner of the semiconductor chip, and a second opening portion opposed to the first opening portion. A plurality of through holes to be coupled to the external terminals are arranged outside the opening. The bonding lead includes a lead wire derived from the through hole into the opening, and a mounting portion over which the protruding electrode is mounted. The bonding lead derived in a direction from an outside of a side of the substrate into the opening, and the bonding lead derived in a direction from a center of the semiconductor chip into the opening are alternately arranged in the opening. The opening of the substrate is formed in a rectangular shape having a planar shape with four corners. The first opening portion has a first corner of the four corners, and the second opening portion has a second corner thereof. A distance between the second corner and a corner of the semiconductor chip adjacent thereto is shorter than that between the first corner and a corner of the semiconductor chip adjacent thereto. In the step (c), the underfill material is dropped from the first opening portion, so that the gap between the substrate and the semiconductor chip is filled with the underfill material.

The effects obtained by the representative aspects of the invention disclosed in the present application will be briefly described below.

In the second opening portion of the insulating film of the substrate corresponding to the corner on the air vent side in injection of the underfill material onto the semiconductor chip, the corner of the second opening portion is made close to the semiconductor chip, which can improve the wettability and spread of the underfill material at the second opening portion. Thus, the exposure of the lead to the second opening portion can be reduced to improve the reliability of the semiconductor device.

DETAILED DESCRIPTION OF THE PREFERRED EMBODIMENTS

Figure 1:
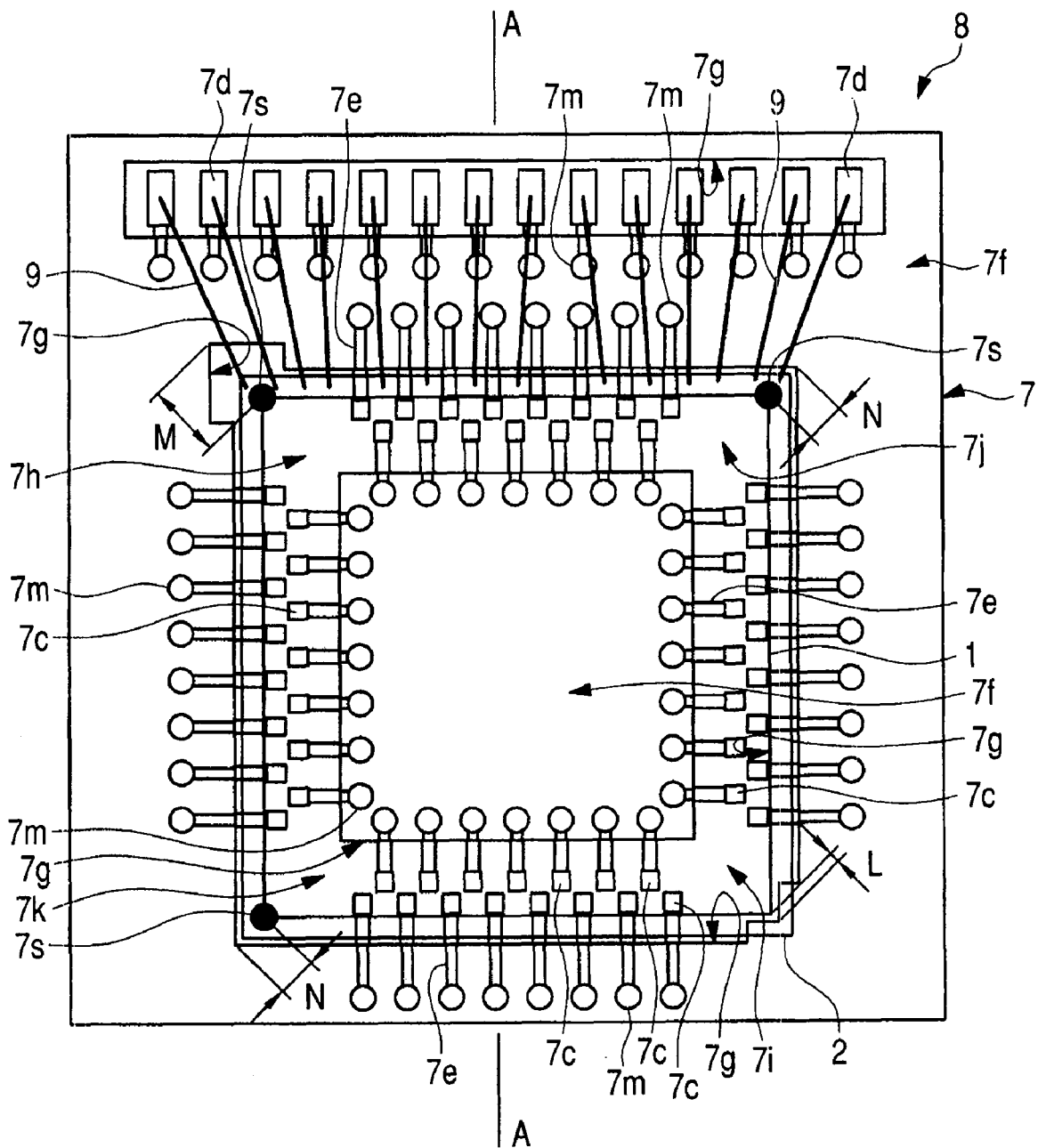
FIG. 1 is a plan view showing an example of a structure of a semiconductor device through a sealing member according to a first embodiment of the invention.

In the following embodiments of the invention, a description of the same or similar part will be omitted below in principle, except when necessary.

The description of the embodiments may be divided into sections or the respective embodiments for convenience if necessary, but these embodiments are related to each other except when specified otherwise. One of the embodiments has a relationship with respect to the other so as to be a modified example of a part or all of the other, or a detailed part or a supplemental description of the other embodiment.

Further, when referring to the number of components or the like (including the number of pieces, the numeral value, the amount, the range, and the like), the embodiments are not limited to a specific value except when specified otherwise and except when clearly limited otherwise in principle, and thus may take a value equal to or more than, or less than the specific value.

Now, the preferred embodiments of the invention will be described in detail below based on the accompanying drawings. In all drawings for explaining the embodiments, a member having the same function is designated by the same reference numeral, and thus a repeated description thereof will be omitted below.

First Embodiment

Figure 2:
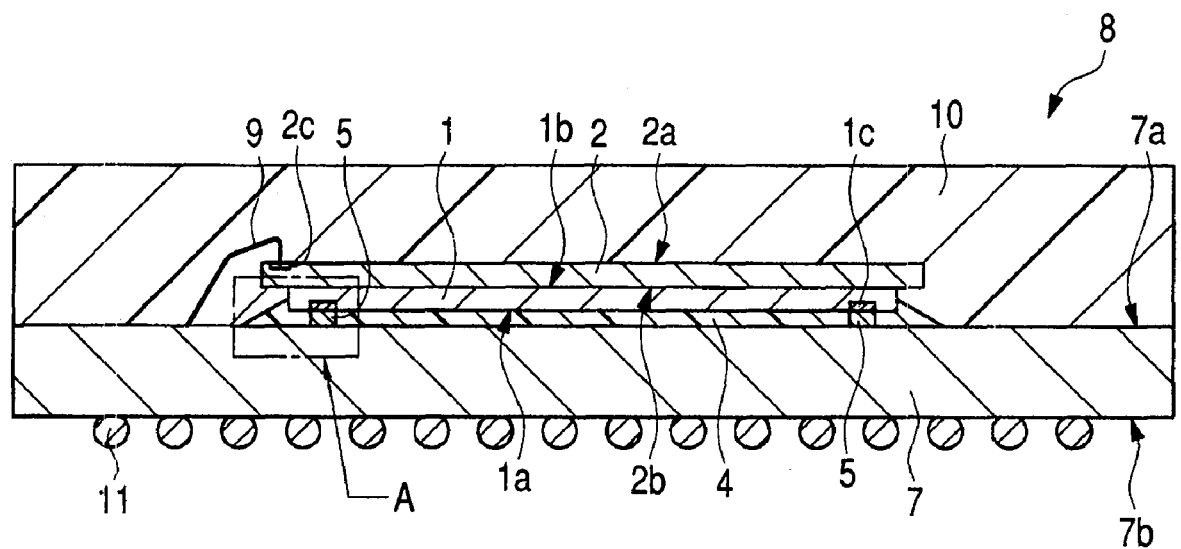
FIG. 2 is a sectional view showing an example of the structure taken along the line A-A of FIG. 1.
Figure 3:
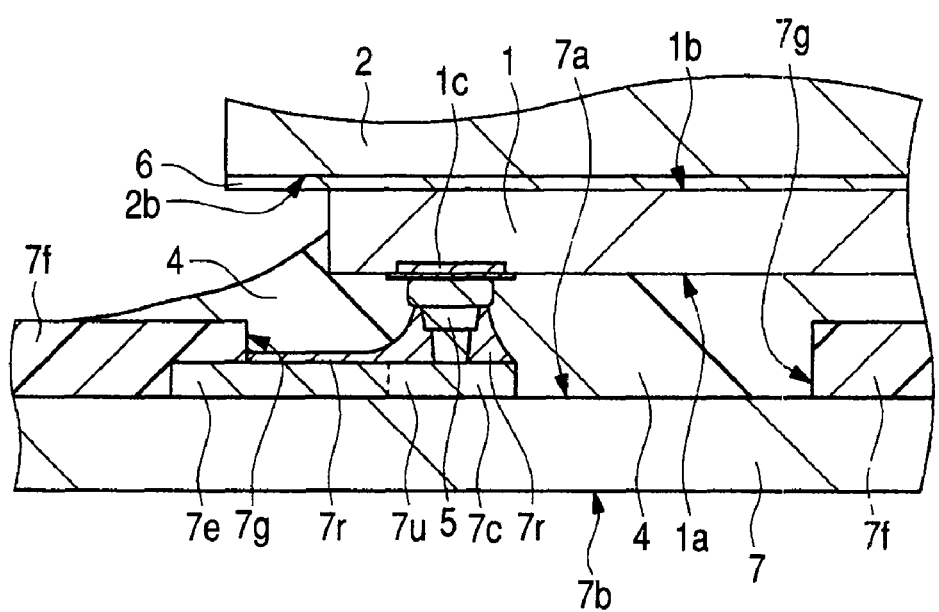
FIG. 3 is a partial enlarged sectional view showing an example of the structure of an A portion shown in FIG. 2.
Figure 4:
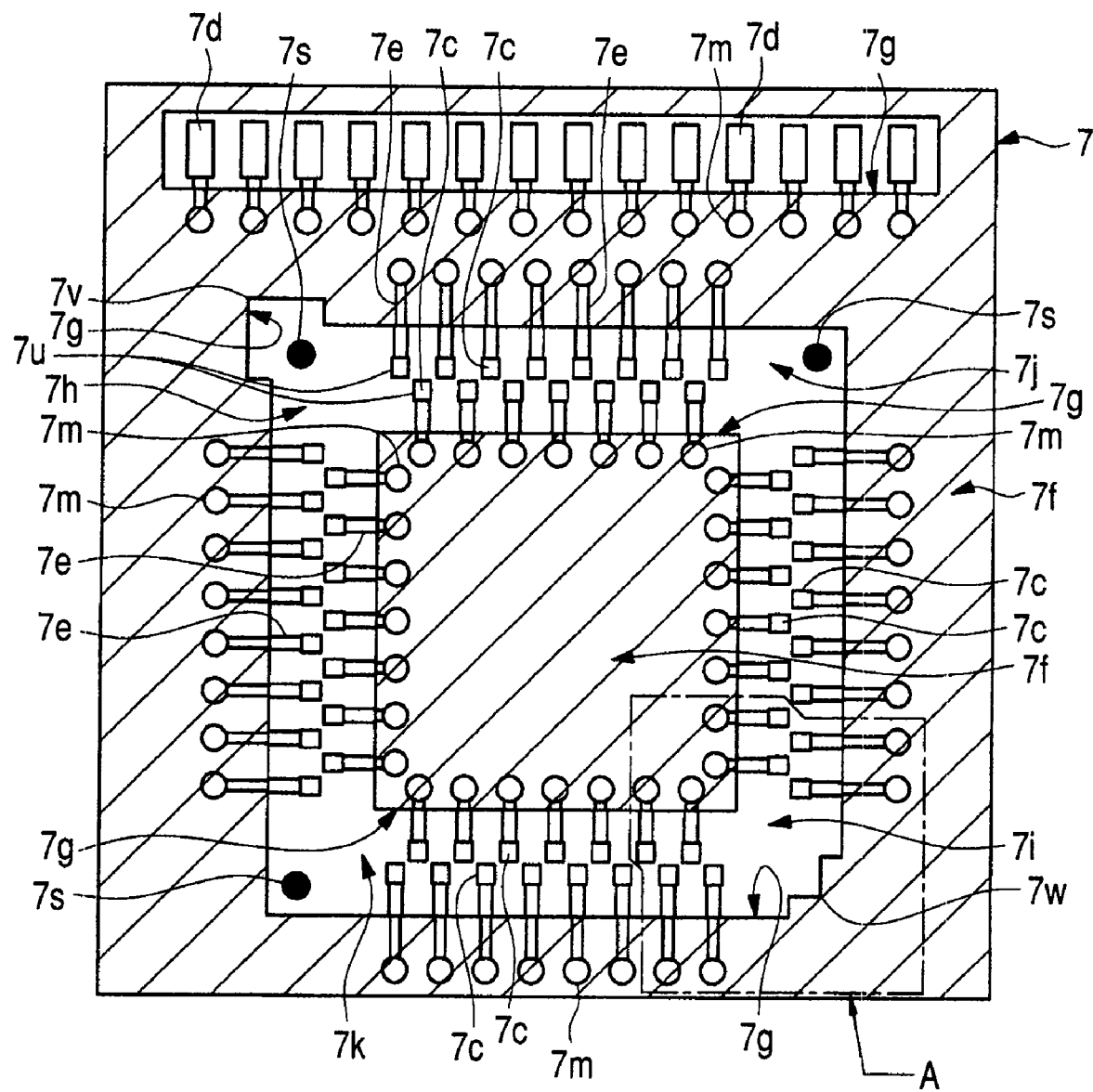
FIG. 4 is a plan view showing an example of a substrate structure incorporated in the semiconductor device shown in FIG. 1.
Figure 5:
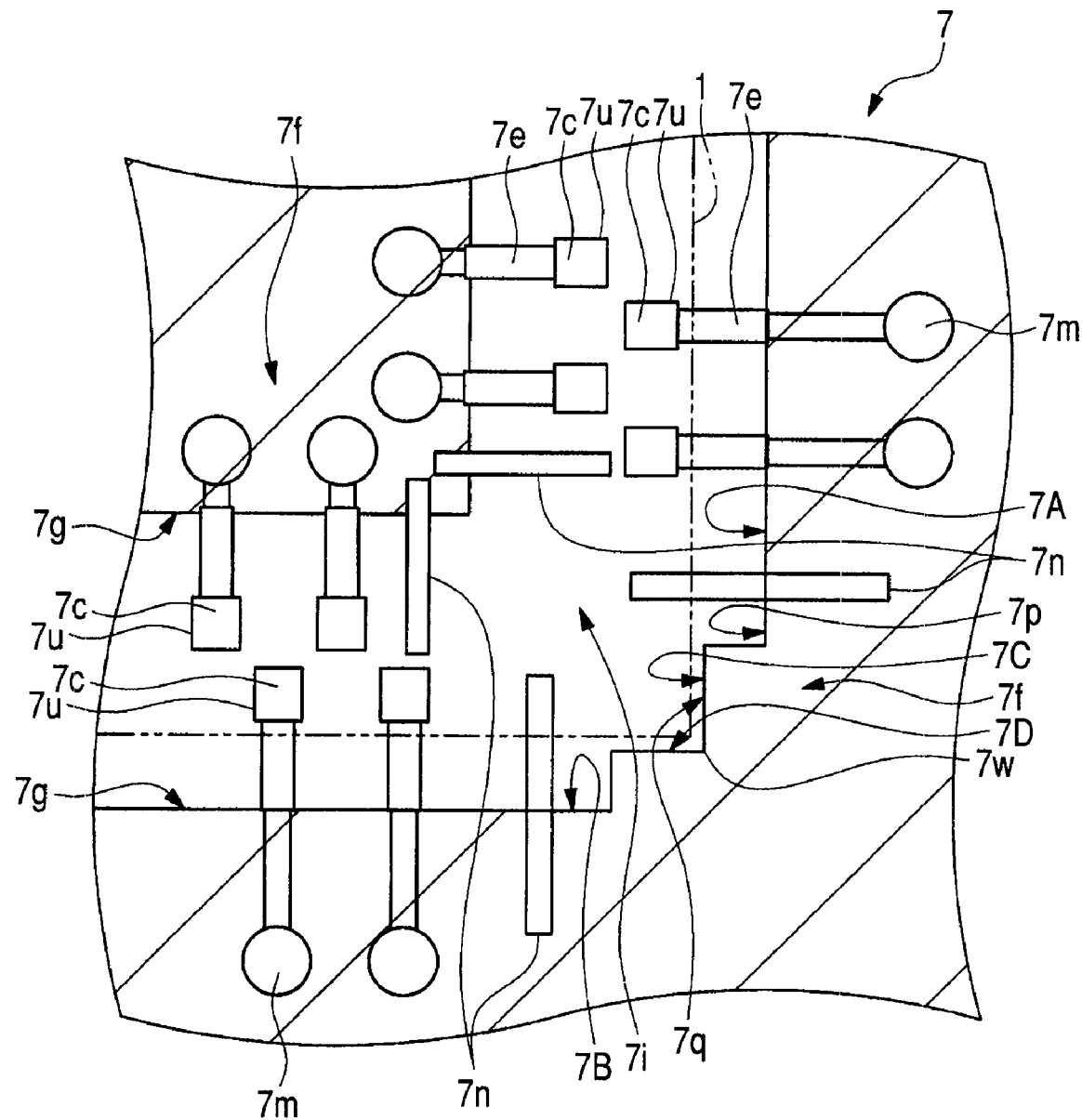
FIG. 5 is a partial enlarged plan view showing an example of the structure of the A portion shown in FIG. 4.
Figure 6:
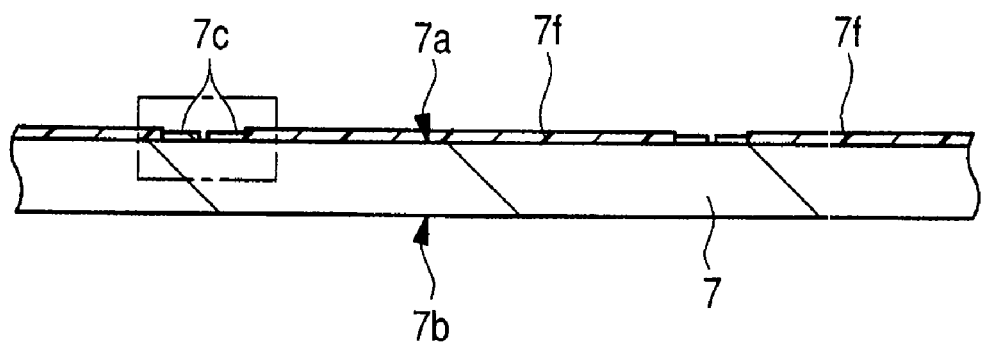
FIG. 6 is a partial sectional view showing an example of the substrate structure shown in FIG. 4.
Figure 7:
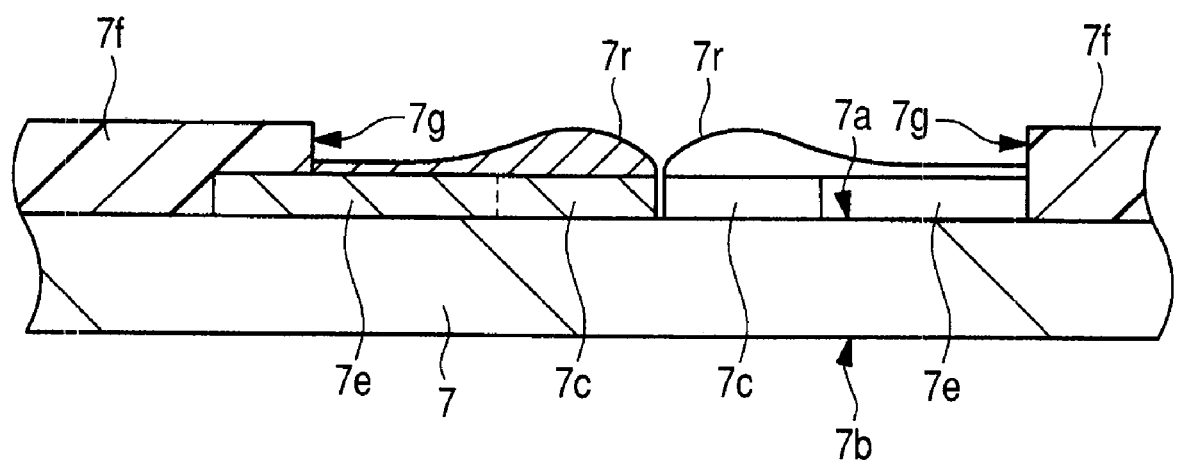
FIG. 7 is a partial enlarged sectional view showing an example of the structure of the A portion shown in FIG. 6.

FIG. 1 is a plan view showing an example of a structure of a semiconductor device through a sealing member according to a first embodiment of the invention. FIG. 2 is a sectional view showing an example of the structure taken along the line A-A of FIG. 1. FIG. 3 is a partial enlarged sectional view showing an example of the structure of an A portion shown in FIG. 2. FIG. 4 is a plan view showing an example of a substrate structure incorporated in the semiconductor device shown in FIG. 1. FIG. 5 is a partial enlarged plan view showing an example of the structure of the A portion shown in FIG. 4. FIG. 6 is a partial sectional view showing an example of the structure of a substrate shown in FIG. 4. FIG. 7 is a partial enlarged sectional view showing an example of the structure of the A portion shown in FIG. 6.

The semiconductor device according to the first embodiment shown in FIGS. 1 to 3 is a semiconductor passage having a multi-pin semiconductor chip flip-chip bonded to the substrate. In the first embodiment, a system in package (SIP) 8 including a microcomputer chip 1 flip-chip bonded to the substrate, and a first memory chip 2 laminated on the microcomputer chip 1 will be described below as one example of the semiconductor device.

The structure of the SIP 8 will now be described below. The SIP 8 includes a wiring board (substrate) 7 with a surface (a main surface, or a surface on which the chip is mounted) 7a, and a back surface 7b opposed thereto, the microcomputer chip (semiconductor chip) 1 flip-chip bonded to the surface 7a of the wiring board 7, the first memory chip 2 laminated on the microcomputer chip 1, and solder balls 11 serving as a plurality of external terminals and provided on the back surface 7b of the wiring board 7. That is, as shown in FIGS. 2 and 3, the microcomputer chip 1 on the lower stage mounted over the surface 7a of the wiring board 7 is mounted facing down, and flip-chip bonded to the wiring board 7 via a plurality of gold bumps 5 serving as a protruding electrode. In contrast, the first memory chip 2 on the upper stage laminated on the microcomputer chip 1 is mounted facing up, and coupled to the microcomputer chip 1 via a film-like adhesive material 6. The first memory chip 2 is further electrically coupled to the wiring board 7 via a plurality of wires 9 (for example, gold wires or the like).

In the microcomputer chip 1 as shown in FIG. 3, the pad 1c serving as a surface electrode formed on the main surface 1a is electrically coupled to the bonding lead 7c of the wiring board 7 via the gold bump 5. At that time, the gold bump 5 is coupled to the solder layer 7f formed on the bonding lead 7c to be electrically coupled thereto. The microcomputer chip 1 is provided with a number of pads for controlling the first memory chip 2 and for receiving and sending signals from and to an external device. Thus, the pads 1c provided on the main surface 1a are arranged in the staggered manner on the respective peripheral edges of four sides of the main surface 1a.

On the other hand, in the first memory chip 2 as shown in FIGS. 1 and 2, the pad 2c serving as a surface electrode formed on the main surface 2a is electrically coupled to the bonding lead 7c of the wiring board 7 via the wires 9.

A gap between the microcomputer chip 1 on the lower stage and the surface 7a of the wiring board 7 is filled with underfill material 4 which is resin as shown in FIG. 2. The underfill material 4 fills the surrounding area of the gold bump 5 thereby to reinforce a flip-chip bonded portion.

A sealing member 10 made of epoxy resin or the like is formed over the surface 7a of the wiring board 7, thereby sealing the microcomputer chip 1, the first memory chip 2, and the wires 9 with resin.

Next, the detailed structure of the wiring board 7 mounted on the SIP 8 will be described below. As shown in FIG. 4, a solder resist film 7f which is an insulating film is formed on the surface 7a of the wiring board 7. In FIGS. 4 and 5, an area indicated by the hatched line is one covered with the solder resist film 7f. An opening 7g is formed at the solder resist film 7f near the center of the surface 7a in a rectangular ring-like shape. The opening 7g is formed in such a shape (a rectangular shape whose planar shape has four corners) that extends substantially along the outer peripheral shape of the microcomputer chip 1 flip-chip bonded. The bonding leads 7c for the flip-chip bonding are exposed to the opening 7g. Since the pads 1c on the main surface 1a of the microcomputer chip 1 are arranged in the staggered manner with a small pitch, the bonding leads 7c electrically coupled and corresponding thereto are also arranged in the staggered manner with a small pitch in the same way. That is, the bonding leads 7c coupled to the pads 1c of the microcomputer chip 1 via the gold bumps 5 are also provided in the staggered arrangement. The term "staggered arrangement" means not the linear arrangement of the pads and leads, but the alternate arrangement of the pads and leads by changing the line of the pad from the line of the lead. Further, the staggered arrangement is provided, for example, by displacing two lines of pads linearly arranged by one pad in the direction of the pad arrangement. The term "small pitch" as used herein means a value less than, for example, 40 μm.

Further, the bonding leads 7c are arranged in parallel in the staggered manner with the small pitch in the opening 7g of the solder resist film 7f of the wiring board 7, which makes it difficult to further arrange the lead wires 7e between the adjacent bonding leads 7c from the viewpoint of space in the opening 7g. Thus, each bonding lead 7c includes the lead wire 7e derived from an interlayer connection wire (through hole) 7m into the opening 7g, and a mounting portion 7u on which the gold bump 5 is mounted. Each other end of the lead 7c is coupled to the lead wire 7e derived from each side inside the opening 7g, and one end thereof, that is, the mounting portion 7u on which the golf bump 5 is mounted is ended near the center of the opening 7g, which is the so-called cantilever lead form. The lead wire 7e coupled to each bonding lead 7c is coupled to the interlayer connection wire 7m and the like, and coupled to a wiring of each layer or of the back surface 7b.

In flip-chip bonding via the gold bump 5, it is effective to previously form the solder layer 7r (solder precoat) made of solder or the like on the bonding lead 7c side for the flip-chip bonding of the wiring board 7. At that time, in order to maintain solder connection between the solder and the gold bump 5 in a good state, the thick solder layer (solder precoat) 7r is preferably formed over the bonding lead 7c as shown in FIG. 7.

Now, an example of a formation method for the semiconductor layer 7r (solder precoat) formed on the bonding leads 7c arranged with the small pitch will be described below. The following method is known as the formation method. That is, an adhesive liquid coat is formed over copper material for forming the bonding lead 7c, and solder powder (solder particles) is applied to the coating. Then, flux is applied to the solder powder, and subjected to reflow soldering. The solder powder is melted to form the solder layer 7r on the leads. The solder layer 7r of the wiring board 7 of the first embodiment is formed by this method.

Further, the forming method for the solder is applied to the bonding lead 7c of the cantilever lead form, such as the wiring board 7 shown in FIG. 4 so as to form the thick solder layer 7r on the bonding lead 7c. In this case, the solder powder attached to the lead wire 7e is collected on the bonding leads 7c by the reflow soldering thereby to form the thick solder layer 7r on the bonding leads 7c as shown in FIGS. 6 and 7.

Thus, an exposed portion of the lead wire 7e leading to the bonding lead 7c for the flip-chip bonding in the opening 7g of the solder resist film 7f needs to be long so as to ensure the amount of solder. Accordingly, in the wiring board 7 having the bonding leads 7c of the cantilever lead form for the flip-chip bonding, the opening 7g of the solder resist film 7f with the bonding leads 7c of the cantilever lead form arranged therein is formed so as to have a wide width.

In such a wiring board 7, as shown in FIGS. 4 and 5, a distance from the corner of a second opening portion 7i located in the direction of a chip diagonal corner with respect to a first opening portion 7h to the corner of the microcomputer chip 1 is shorter than that from the corner of the first opening portion 7h corresponding to the corner on the injection side of the underfill material 4 to the corner of the chip 1 in the opening 7g of the solder resist film 7f corresponding to four corners of the microcomputer chip 1. That is, a distance between a second corner 7w of the second opening portion 7i and the corner of the microcomputer chip 1 adjacent thereto is shorter than that between a first corner 7v of the first opening portion 7h and the corner of the chip 1 adjacent thereto.

That is, among the four opening portions of the opening 7g at the solder resist film 7f corresponding to the four corners of the microcomputer chip 1 shown in FIG. 1, a distance (L) from the corner of the second opening portion 7i on the air vent side located in the chip diagonal direction with respect to the first opening portion 7h on the underfill material injection side to the corner of the chip 1 is shorter than a distance (M) from the corner of the first opening portion 7h to the corner of the chip 1 (L<M). That is, the second opening portion 7i of the solder resist film 7f corresponding to the corner on the air vent side of the microcomputer chip 1 is made narrower by bringing the corner of the second opening portion 7i closer to the microcomputer chip 1 than the first opening portion 7h on the underfill material injection side.

In other words, as shown in FIG. 5, the second opening portion 7i of the solder resist film 7f is provided with a first end 7p formed along the outer peripheral shape of the microcomputer chip 1, and a second end 7q leading to the first end 7p and positioned between the first end 7p and an end of the chip 1. The second end 7q is ended at the corner of the second opening portion 7i. At that time, the second end 7q of the second opening portion 7i is formed along the corner of the microcomputer chip 1, and a distance between the end of the microcomputer chip 1 and the second end 7q is, for example, 50 μm.

In this way, the opening portion of the solder resist film 7f is made narrower by bringing the corner of the second opening portion 7i of the solder resist film 7f on the air vent side closer to the microcomputer chip 1 than the first opening portion 7h on the underfill material injection side. Thus, the wettability and spread of the underfill material 4 at the second opening portion 7i can be improved thereby to reduce exposure of the lead at the second opening portion 7i.

This results in improvement of reliability of the SIP 8.

The opening 7g has a first side 7A and a second side 7B. The second corner 7w corresponds to an intersection point of a third side 7C positioned between the first side 7A and the outer periphery of the chip and leading to the first side 7A, and a fourth side 7D positioned between the second side 7B and the outer periphery of the chip and leading to the second side 7B.

In the wiring board 7 assembled in the SIP 8 of the first embodiment, as shown in FIG. 1, a distance (N) from the corner of the third opening portion 7j to the corresponding corner of the microcomputer chip 1 is shorter than the distance (M) at the first opening portion 7h, and longer than the distance (L) from the second opening portion 7i (L<N<M). Likewise, the distance (N) at the fourth opening portion 7k from the corner of the fourth opening portion 7k to the corner of the microcomputer chip 1 is shorter than the distance (M) at the first opening portion 7h, like the third opening portion 7j, and longer than the distance (L) at the second opening portion 7i (L<N<M).

Thus, among the distance between the corner of the microcomputer chip 1 and the corner of each of the first opening portion 7h, the second opening portion 7i, the third opening portion 7j, and the fourth opening portion 7k in the opening 7g of the solder resist film 7f of the wiring board 7, the distance (M) from the first opening portion 7h on the underfill material injection side is the longest one, and the distance (N) from each of the third opening portion 7j and the fourth opening portion 7k is the second longest one, and the distance (L) from the second opening portion 7i on the air vent side is shortest.

That is, among the opened areas of the opening portions in the opening 7g of the solder resist film 7f corresponding to the respective corners of the microcomputer chip 1, the opened area at the first opening portion 7h on the underfill material injection side is the largest one, the opened area at each of the third opening portion 7j and the fourth opening portion 7k is the second largest one, and the opened area at the second opening portion 7i on the air vent side is the smallest one.

As shown in FIG. 5, dummy leads 7n are provided at both ends of a bonding lead line corresponding to one side of the microcomputer chip 1 in the wiring board 7 of the first embodiment. Variations in thickness of the solder layer 7r become large depending on the pattern. This relates to convection of reflux in a reflow process for forming the solder layer 7r. That is, when the lead at the end (on the outermost side) is viewed as reference, both sides of the lead at the end are under the different condition in terms of the presence or absence of another lead. This makes the convection of the reflux nonuniform at both sides of the lead. The nonuniform occurrence of convection of the reflux causes solder powder to be nonuniformly bonded to the leads. This results in variations in thickness of solder film or layer. The dummy lead 7n serves to transfer the phenomenon of occurrence of variations in thickness of the solver layer 7r in the lead located on the outermost side of the bonding lead line when the solder layer 7r (solder precoat) is formed over the bonding lead 7c. That is, the dummy lead 7n located on the outermost side compensates for variations in thickness of the solder layer 7r, thereby uniformizing the thickness of the solder layer 7r on the bonding lead 7c located on the inner side of the dummy lead 7n.

Provision of the dummy lead 7n in the wiring board 7 can make the thickness of the solder layer 7r on the bonding lead 7c uniform, thereby improving the reliability of the SIP 8.

One or more dummy leads 7n may be provided at the end of the bonding lead line. Alternatively, no dummy lead 7n may be provided. When no dummy lead is provided, instead, the lead at the end may be assigned to a ground or the like. A product has a plurality of grounds in many cases. For this reason, even disconnection of about only one lead at the end has little influence on product performance.

As shown in FIGS. 1 and 4, target marks 7s for identification of the substrate are formed at three corners of the rectangular ring-like opening 7g of the solder resist film 7f in the wiring board 7 of the first embodiment. The target mark 7s is a mark for identification of the substrate in mounting, and is formed, for example, in a circular lead pattern or the like as shown in FIG. 1. The shape of the target mark 7s may be in a rectangular shape or in a cross shape. The target mark 7s may be disposed outside the opening 7g. For identification of the substrate, at least two target marks 7s should be provided in the wiring board 7 so as to detect the rotation position of the substrate in the direction of θ using the mark 7s. Three marks may be provided like the first embodiment. In the wiring board 7 of the first embodiment, the first opening portion 7h, the third opening portion 7j, and the fourth opening portion 7k are provided. As shown in FIG. 1, the corner of the microcomputer chip 1 is located near the center of the circular target mark 7s.

As shown in FIGS. 1 and 4, terminals 7d for wire connection are formed in one line at one end of a predetermined side of the surface 7a of the wiring board 7 along the side in the first embodiment. The terminals 7d for wire connection are arranged in line and exposed to the opening 7g of the solder resist film 7f. Each terminal 7d is electrically coupled to the pad 2c of the first memory chip 2 on the upper stage laminated over the microcomputer chip 1 via wires 9.

In the SIP 8 of the first embodiment, the microcomputer chip 1 and the first memory chip 2 are formed of, for example, silicon, and each semiconductor chip has various integrated circuits or circuits formed therein. The wire 9 is, for example, a gold wire. Further, the sealing member 10 is formed of, for example, thermosetting epoxy resin or the like.

The bonding lead 7c and the lead wire 7e of the wiring board 7, the terminal 7d for wire connection, the target mark 7s, and the like include, for example, a copper pattern.

Now, an assembly procedure of the semiconductor device (SIP 8) of the first embodiment will be described below with reference to the flowchart shown in FIG. 8.

Figure 8:
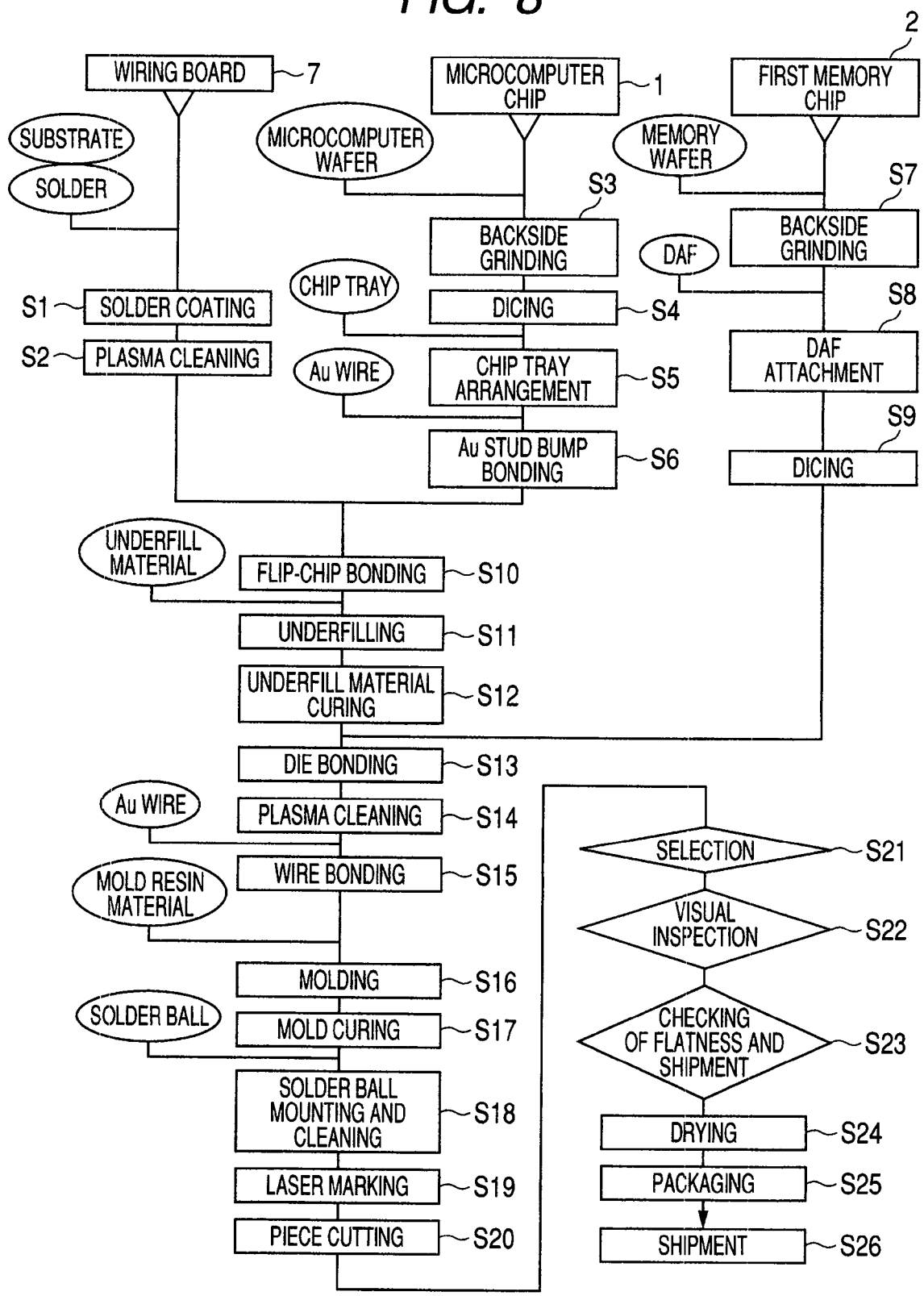
FIG. 8 is a flowchart showing an example of an assembly procedure of the semiconductor device shown in FIG. 1.
Figure 9:
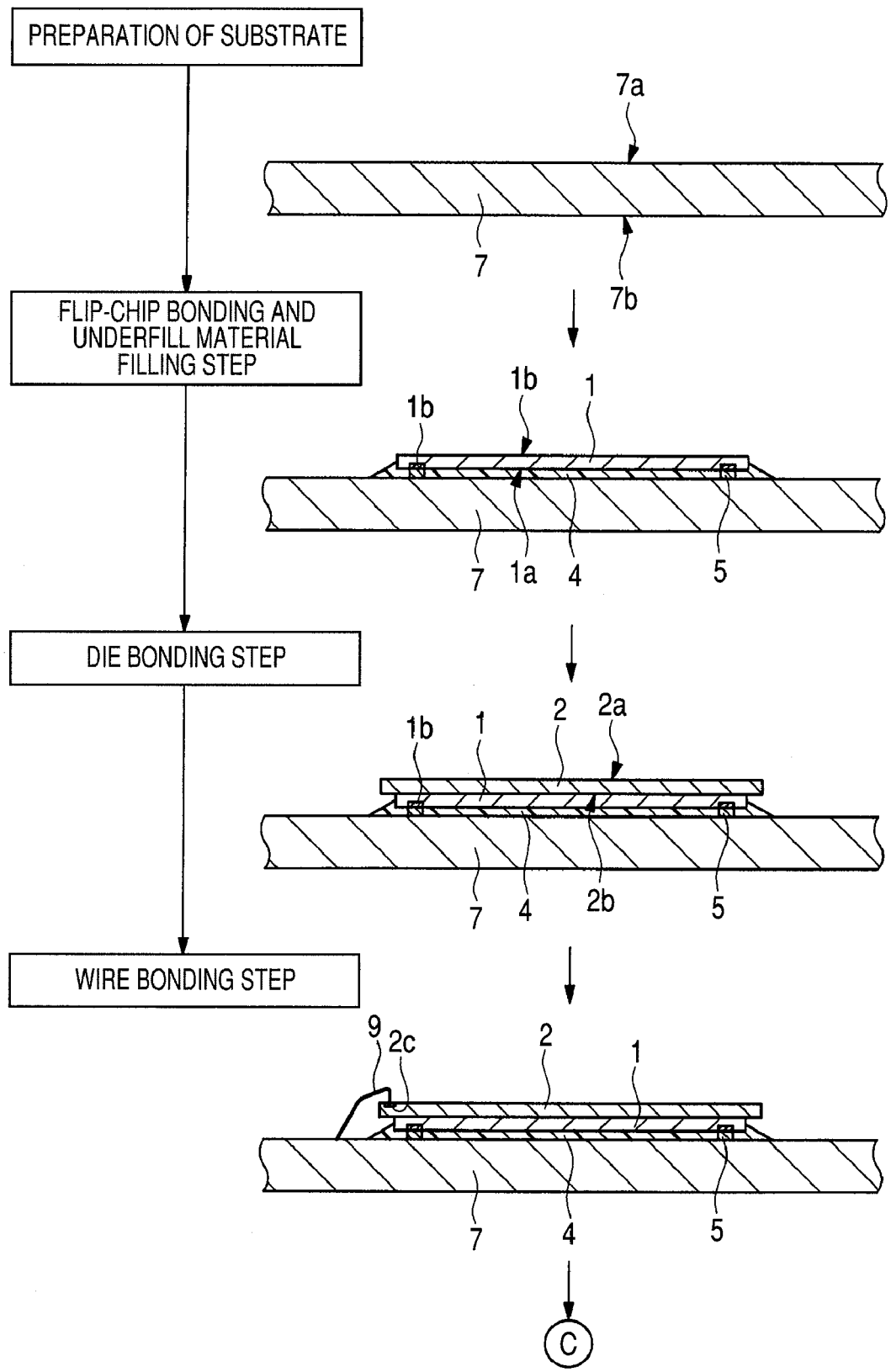
FIG. 9 is a process flowchart showing an example of main steps in the assembly procedure shown in FIG. 8.
Figure 10:
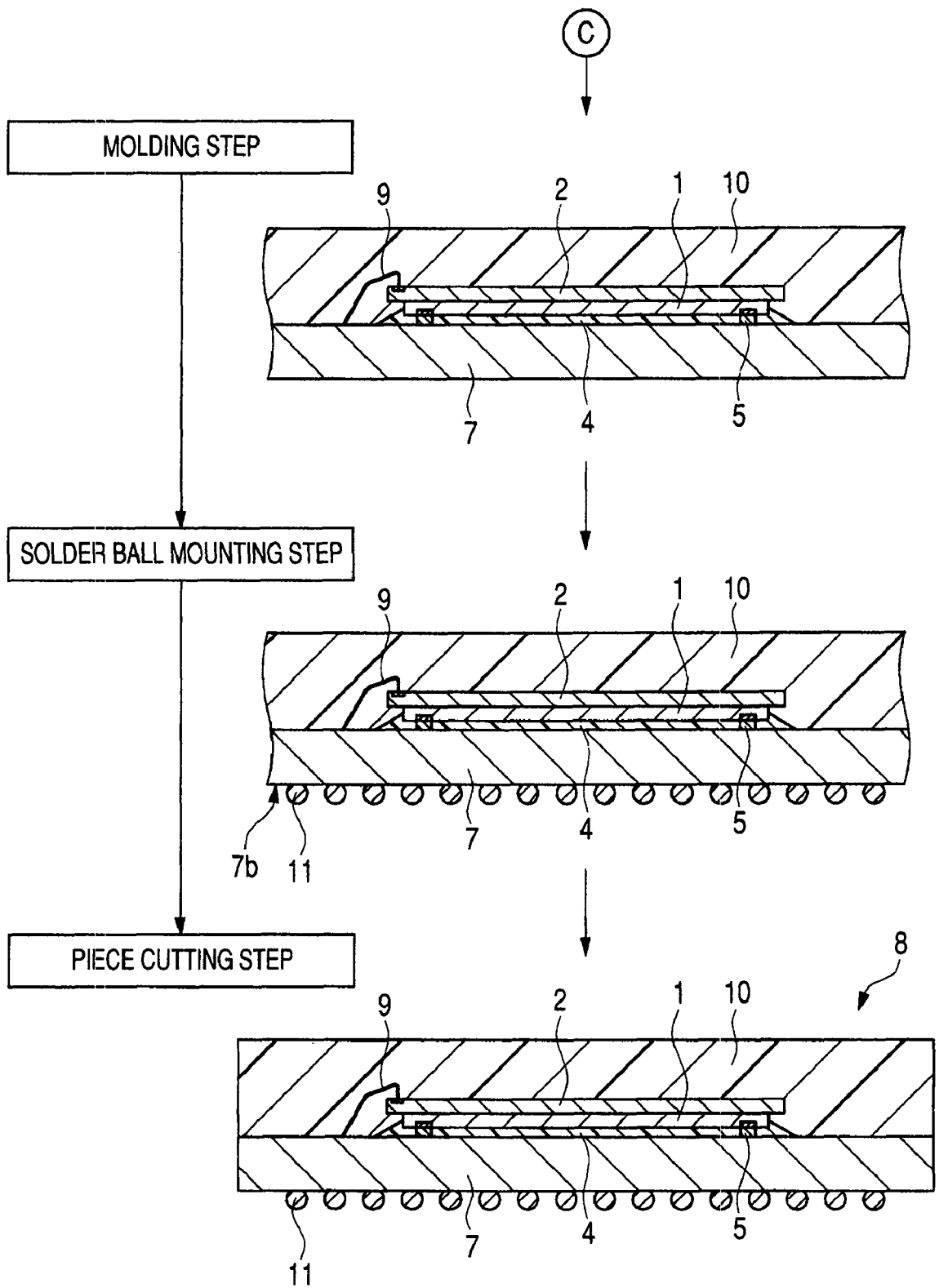
FIG. 10 is a process flowchart showing an example of other main steps in the assembly procedure shown in FIG. 8.
Figure 11:
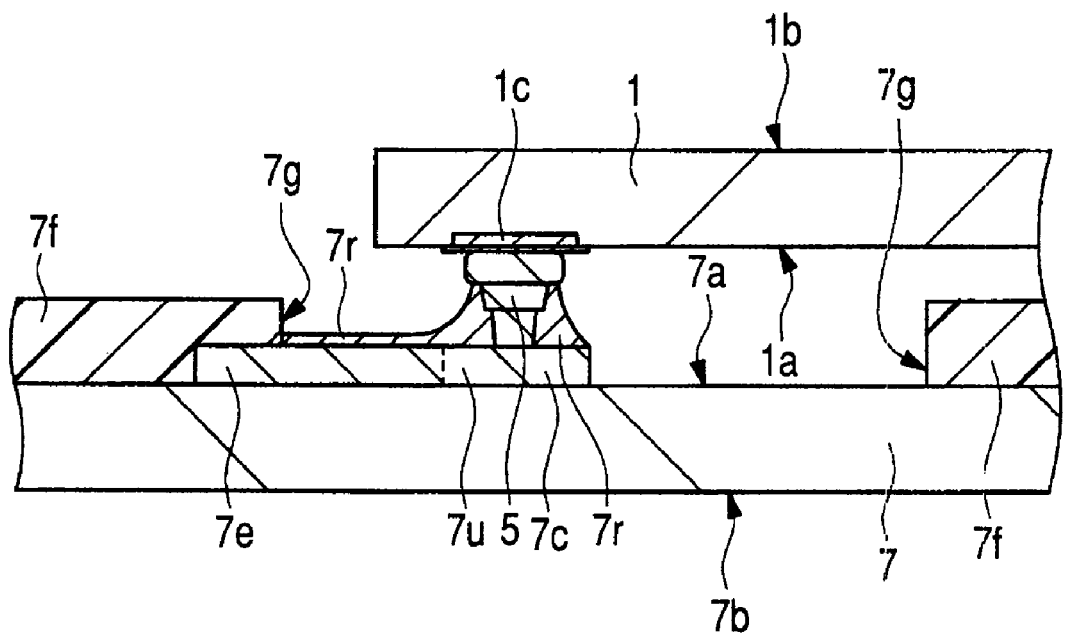
FIG. 11 is a partial enlarged sectional view showing an example of a structure after flip-chip bonding in the assembly procedure shown in FIG. 8.
Figure 12:
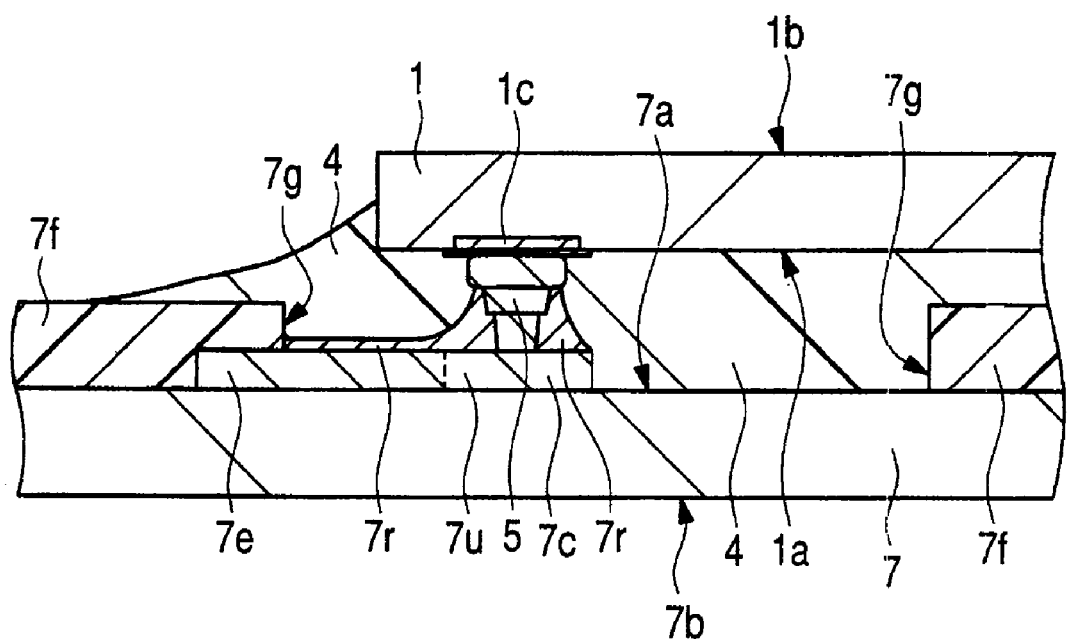
FIG. 12 is a partial enlarged sectional view showing an example of a structure after curing underfill material in the assembly procedure shown in FIG. 8.
Figure 13:
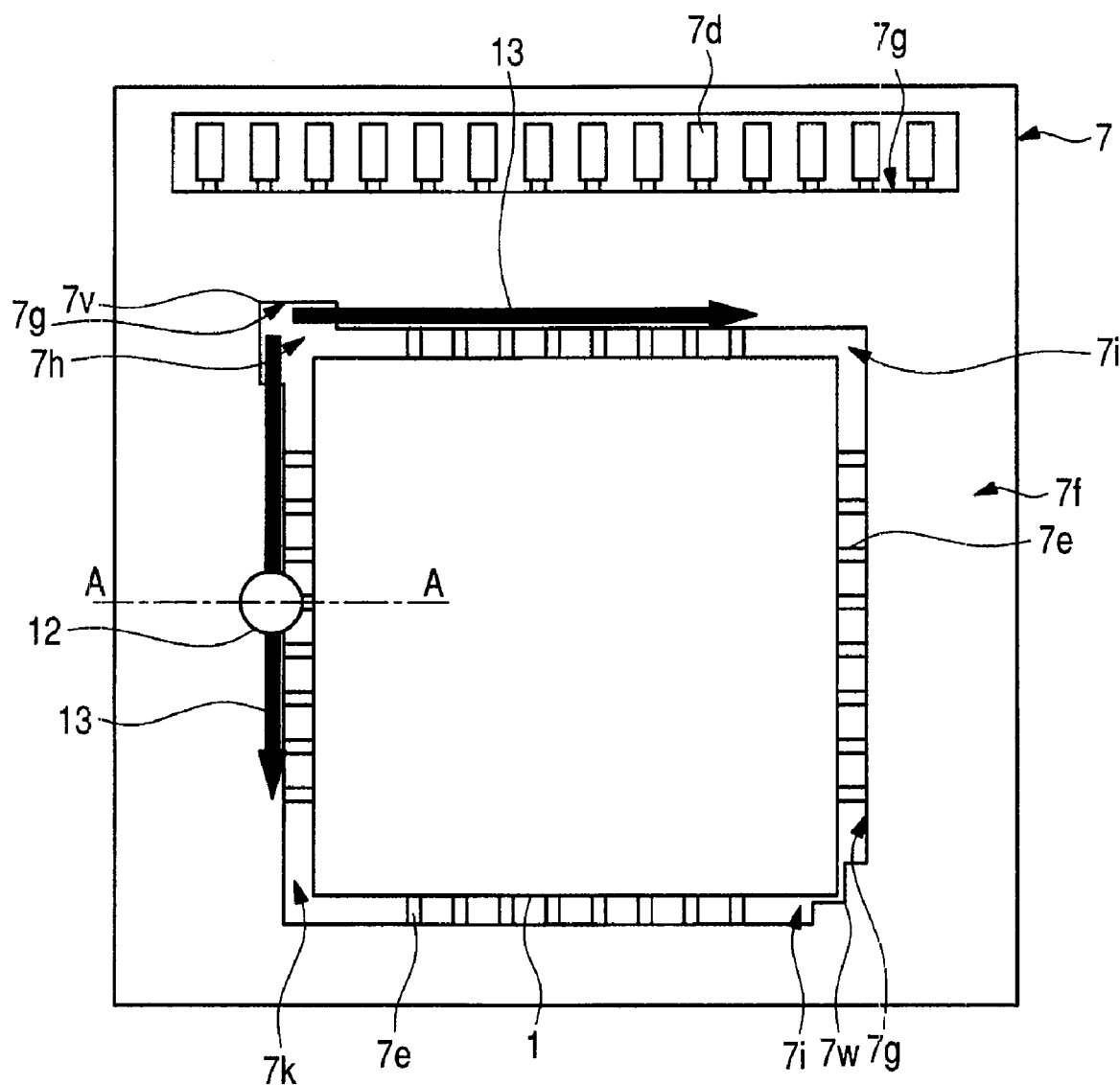
FIG. 13 is a plan view showing an example of paths for coating in an underfill step of the assembly procedure shown in FIG. 8.
Figure 14:
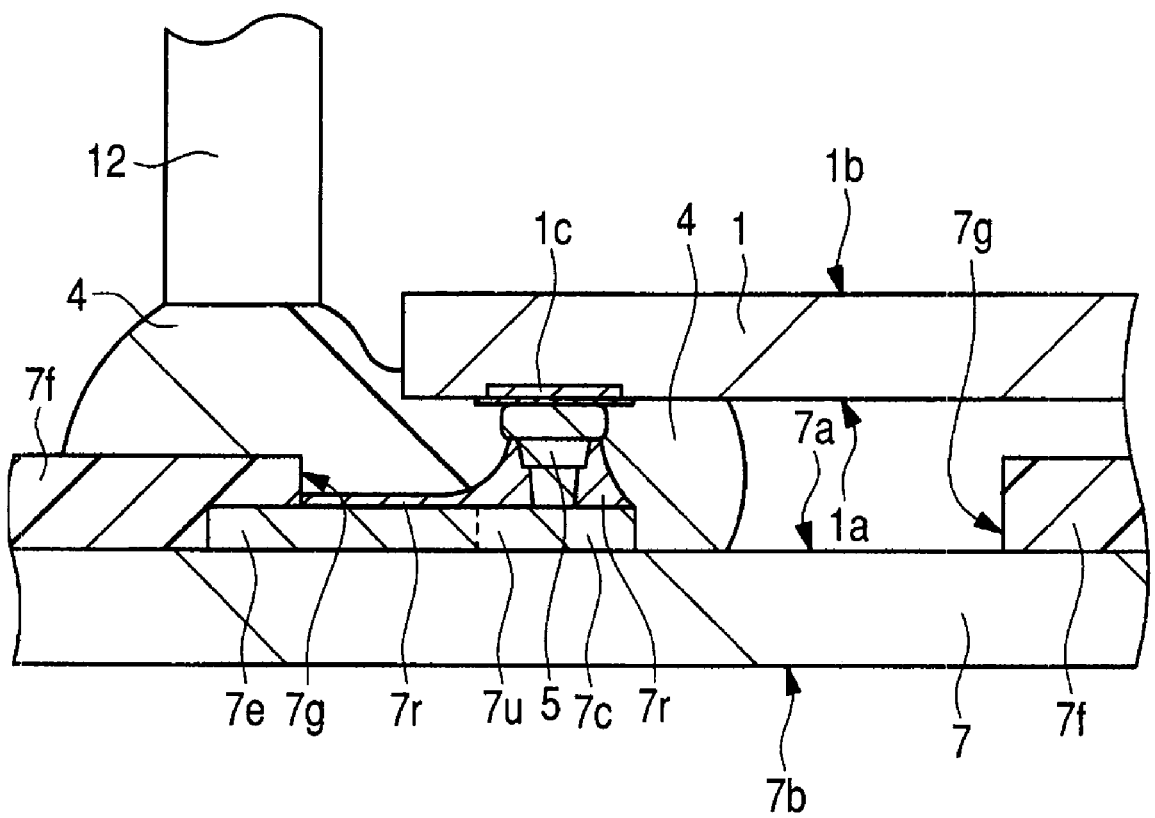
FIG. 14 is a partial enlarged sectional view showing an example of a structure taken along the line A-A of FIG. 13.

FIG. 8 is a flowchart showing an example of the assembly procedure of the semiconductor device shown in FIG. 1. FIG. 9 is a process flowchart showing an example of main steps of the assembly procedure shown in FIG. 8. FIG. 10 is a process flowchart showing an example of main steps of the assembly procedure shown in FIG. 8. FIG. 11 is a partial enlarged sectional view showing an example of a structure after flip-chip bonding in the assembly procedure shown in FIG. 8. FIG. 12 is a partial enlarged sectional view showing an example of a structure after curing underfill material in the assembly procedure shown in FIG. 8. FIG. 13 is a plan view showing an example of paths for coating in an underfill step of the assembly procedure shown in FIG. 8. FIG. 14 is a partial enlarged sectional view showing an example of a structure taken along the line A-A of FIG. 13.

First, solder coating is applied to form the wiring board 7 in step S1 shown in FIG. 8. In the wiring board 7, the bonding leads 7c for the flip-chip bonding to be exposed to the opening 7g of the solder resist film 7f on the surface 7a need to be arranged in the staggered manner with a small pitch, and respectively formed in the cantilever lead form. The thick solder layer 7r needs to be formed on the bonding lead 7c as shown in FIG. 7. Thus, an adhesive liquid coat is formed over copper material for forming the bonding lead 7c, and solder powder (solder particles) is applied thereon. Then, flux is applied to the solder powder, and subjected to reflow soldering to melt the solder power, which forms the solder layer (solder precoat) 7r on the bonding leads 7c. This method is preferably used.

Accordingly, in the wiring board 7, since the respective bonding leads 7c for the flip-chip bonding are arranged in the cantilever lead form in the opening 7g of the solder resist film 7f, the opening 7g of the solder resist film 7f is widely formed so as to have a wide width. The opening 7g is formed in the resist film 7f in the rectangular ring-like shape along the outer peripheral shape of the microcomputer chip 1 mounted on the lower stage. As shown in FIG. 4, the bonding leads 7c for the flip-chip bonding are arranged in the opening 7g in the staggered manner with the small pitch and in the cantilever lead form. Within the opening 7g of the solder resist film 7f corresponding to the four corners of the microcomputer chip 1 mounted, the second opening portion 7i of the solder resist film 7f corresponding to the corner on the air vent side of the chip 1 is made narrower by bringing the corner of the second opening portion 7i closer to the microcomputer chip 1 than the first opening portion 7h on the underfill material injection side.

In other words, in the opening 7g of the solder resist film 7f formed along the outer peripheral shape of the microcomputer chip 1 mounted, only the first opening portion 7h on the underfill material injection side at the corner is formed widely as compared to other portions. That is, as shown in FIG. 4, the opening 7g of the solder resist film 7f in an area with the bonding leads 7c arranged therein is formed to have a certain width at the four sides. That is, when the area of the opening 7g with the bonding leads 7c arranged therein is formed more widely, the amount of coating of the solder material on the bonding leads 7c becomes nonuniform in forming the solder layer 7r. Thus, the width of the opening 7g with the bonding leads 7c arranged therein is made constant. Accordingly, the width of the area of opening 7g with the bonding leads 7c arranged therein is made constant, which can provide the certain amount of solder material to the respective bonding leads 7c.

As shown in FIG. 4, the target marks 7s for identification of the substrate are formed in the wiring board 7 at the first opening portion 7h, the third opening portion 7j, and the fourth opening portion 7k of the rectangular ring-like opening 7g of the solder resist film 7f.

After the solder precoat process, plasma cleaning is performed to clean the surface of the wiring board 7 in step S2 shown in FIG. 8. The plasma cleaning is performed for cleaning the surfaces of the solder film and the substrate. Cleaning of the surface of the solder film can stabilize the wetting and going up of the solder to the Au bump. Further, cleaning of the substrate surface can improve the permeability of the underfill material 4 and ensure adhesion of the underfill material 4 to the substrate after curing.

On the other hand, a microcomputer wafer for a microcomputer chip is supplied, and the backside grinding is performed so as to form the microcomputer chip 1 in step S3. That is, the back surface of the microcomputer wafer is polished until the wafer has a predetermined thickness. Thereafter, dicing is performed in step S4 to obtain the microcomputer chips 1.

Further, a chip tray is supplied, and an arrangement process using the chip tray is performed in step S5. At this time, the microcomputer chips 1 obtained by the dicing process are accommodated in the chip tray.

Thereafter, an Au wire is supplied to perform Au stud bump bonding in step S6. At this time, the use of the Au wire forms Au bumps 5 on the pads 1c on the main surface 1a of each microcomputer chip 1.

On the other hand, a memory wafer for the memory chip is supplied and backside grinding is performed so as to form the first memory chip 2 in step S7. That is, the back surface of the memory wafer is polished until the memory wafer has a predetermined thickness.

Thereafter, a die attach film (DAF, or a film-like adhesive 6) is supplied, and DAF attachment is performed in step S8. That is, the DAF is bonded to the back surface of the memory wafer.

Then, dicing is performed to obtain the first memory chips 2 in step S9.

Thereafter, the wiring board 7 having the structure shown in FIG. 4 is prepared by a substrate preparation step shown in FIG. 9 to assemble the SIP 8.

First, flip-chip bonding is performed in step S10 shown in FIG. 8. That is, a flip-chip bonding and underfill material filling step is performed as shown in FIG. 9. As shown in FIG. 11, the bonding lead 7c of the wiring board 7 is coupled to the microcomputer chip 1 via the gold bump 5, so that the microcomputer chip 1 is flip-chip bonded to the wiring board 7. At that time, the gold bump 5 over the microcomputer chip 1 is coupled to the solder layer 7r on the bonding lead 7c of the wiring board 7 by thermal compression. Since the solder layer 7r is formed thick on the bonding lead 7c, the coupling strength between the gold bump 5 and the solder can be ensured.

After the completion of the flip-chip bonding, the microcomputer chip 1 is mounted over the surface 7a of the wiring board 7 with its back surface 1b directed upward as shown in FIG. 11.

Thereafter, an underfill process is performed in step S11 shown in FIG. 8. An underfill material 4 is dropped in the first opening portion 7h on the injection side of the underfill material 4 corresponding to the corner of the microcomputer chip 1, and a gap between the wiring board 7 and the microcomputer chip 1 is filled with the underfill material 4. That is, as shown in FIG. 14, the underfill material 4 is dropped from the above via a nozzle 12 into the first opening portion 7h on the injection side of the underfill material 4 corresponding to the corner of the microcomputer chip 1. Thus, the underfill material 4 penetrates between the microcomputer chip 1 and the wiring board 7 from one corner corresponding to the first opening portion 7h of the microcomputer chip 1. That is, the underfill material 4 penetrates not from the corners of the microcomputer chip 1, but from only one corner thereof, which can make it difficult to form voids.

In application of the underfill material, the underfill material 4 is dropped into the first opening portion 7h on the underfill injection side formed by widely opening the solder resist film 7f via the nozzle 12, and then the underfill material 4 is dropped and applied while moving the nozzle 12 along the side of the microcomputer chip 1 as indicated by the track 13 of the nozzle 12 shown in FIG. 13. At that time, the movement of the nozzle 12 is stopped before reaching the corner of the same side of the microcomputer chip 1, which stops dropping of the underfill material 4.

That is, the nozzle 12 is moved along the side of the microcomputer chip 1, and then the movement of the nozzle 12 is stopped before the end of the same side (corner). By stopping of the nozzle before the next corner, the underfill material 4 can be prevented from entering the outer periphery of the chip from the next corner as a starting point. Thus, the occurrence of voids can be prevented.

As mentioned above, the gap between the wiring board 7 and the microcomputer chip 1 can be filled with the underfill material 4, while suppressing the occurrence of the voids as shown in the flip-chip bonding and underfill material filling step in FIG. 9, and also in FIG. 12.

According to the assembly of the semiconductor device according to the first embodiment, in the second opening portion 7i of the solder resist film 7f of the wiring board 7 corresponding to the corner of the microcomputer chip 1 on the air vent side in injection of the underfill material onto the microcomputer chip 1, the corner of the second opening portion 7i of the solder resist film 7f is made close to the chip 1. Thus, the wettability and spread of the underfill material 4 at the second opening portion 7i corresponding to the corner of the microcomputer chip 1 can be improved.

That is, the corner of the second opening portion 7i of the solder resist film 7f is made close to the microcomputer chip 1, which facilitates wetting and spreading of the underfill material 4 dropped from the nozzle 12 along a side wall of the microcomputer chip 1 because of the narrow second opening portion 7i on the air vent side.

Thus, the exposure of the lead to the second opening portion 7i can be reduced.

As a result, the reliability of the SIP 8 can be improved.

After filling with the underfill material 4, the underfill material is cured in step S12 shown in FIG. 8. That is, the underfill material 4 charged is heated and cured at a predetermined temperature.

Thereafter, die bonding is performed in step S13 shown in FIG. 8. The first memory chip 2 is laminated on the microcomputer chip 1 in the die bonding step shown in FIG. 9. At that time, the first memory chip 2 is mounted facing up, and laminated on the back surface 1b of the microcomputer chip 1 mounted facing down. That is, as shown in FIG. 3, the film-like adhesive 6 is bonded to the back surface 2b of the first memory chip 2 thereby to couple the back surface 1b of the microcomputer chip 1 to the back surface 2b of the first memory chip 2.

Then, plasma cleaning is performed to clean the terminals 7d for wire bonding and the like on the surface 7a of the wiring board 7 in step S14 shown in FIG. 8.

Thereafter, the Au wire is supplied and wire bonding is performed in step S15 shown in FIG. 8. In the wire bonding step shown in FIG. 9, the first memory chip 2 on the upper stage mounted facing up and laminated is electrically coupled to the wiring board 7 or the like via the wire 9, such as a gold wire. That is, as shown in FIGS. 1 and 2, the pads 2c of the first memory chip 2 are electrically coupled to the terminals 7d for the wire bonding of the wiring board 7 corresponding to the pads by the wires 9.

Then, a mold resin material is supplied, and molding is performed using the material in step S16 shown in FIG. 8. In the mold step shown in FIG. 10, the microcomputer 1, the first memory chip 2, the wires 9, the underfill material 4, and the like are sealed with resin by the sealing member 10 made of mold resin.

After completion of the molding, mold curing is performed in step S17 shown in FIG. 8. That is, the sealing member 10 formed is heated and cured at a predetermined temperature.

Then, solder balls are supplied, and the balls are mounted and cleaned in step S18 shown in FIG. 8. In the ball bonding step shown in FIG. 10, solder balls 11 serving as external terminals are provided on the back surface 7b of the wiring board 7, for example, in a lattice-like arrangement, and cleaned by flux cleaning or the like.

Then, laser marking is performed in step S19 shown in FIG. 8 thereby to put a mark about desired information, for example, on the surface or the like of the sealing member 10.

Thereafter, piece cutting is performed in step S20 shown in FIG. 8. In the piece cutting step shown in FIG. 10, the sealing member 10 and the wiring board 7 are cut into packages.

Then, good products of the packages are separated from bad products of the packages by a selection process in step S21 shown in FIG. 8. Further, the outer appearance of each package is checked by an outer appearance checking process in step S22.

Thereafter, flatness and shipment is checked in step S23, drying is performed in step S24, packaging is performed in step S25, and finally the product is shipped in step S26.

Now, a modified example of the first embodiment will be described below.

Figure 15:
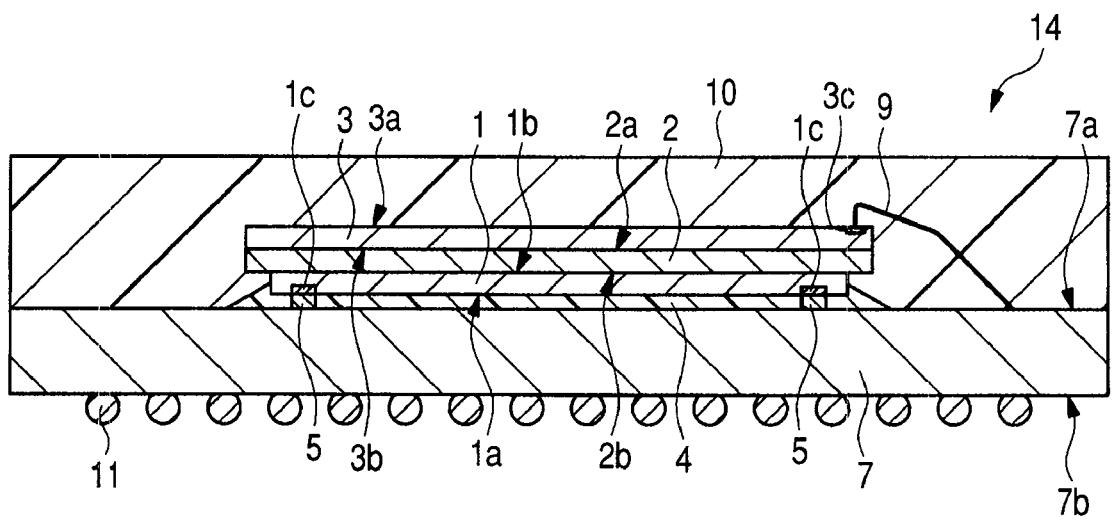
FIG. 15 is a sectional view showing the structure taken in the direction of a wire ring of a memory chip on an upper stage of a semiconductor device in a first modified example of the first embodiment of the invention.
Figure 16:
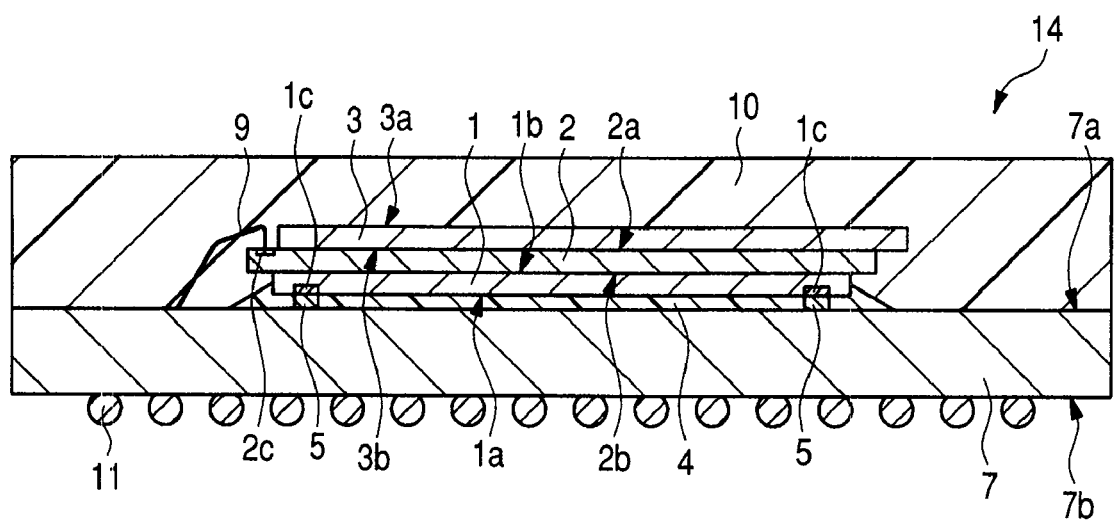
FIG. 16 is a sectional view showing the structure taken in the direction of the wire ring of a memory chip on a lower stage of the semiconductor device shown in FIG. 15.
Figure 17:
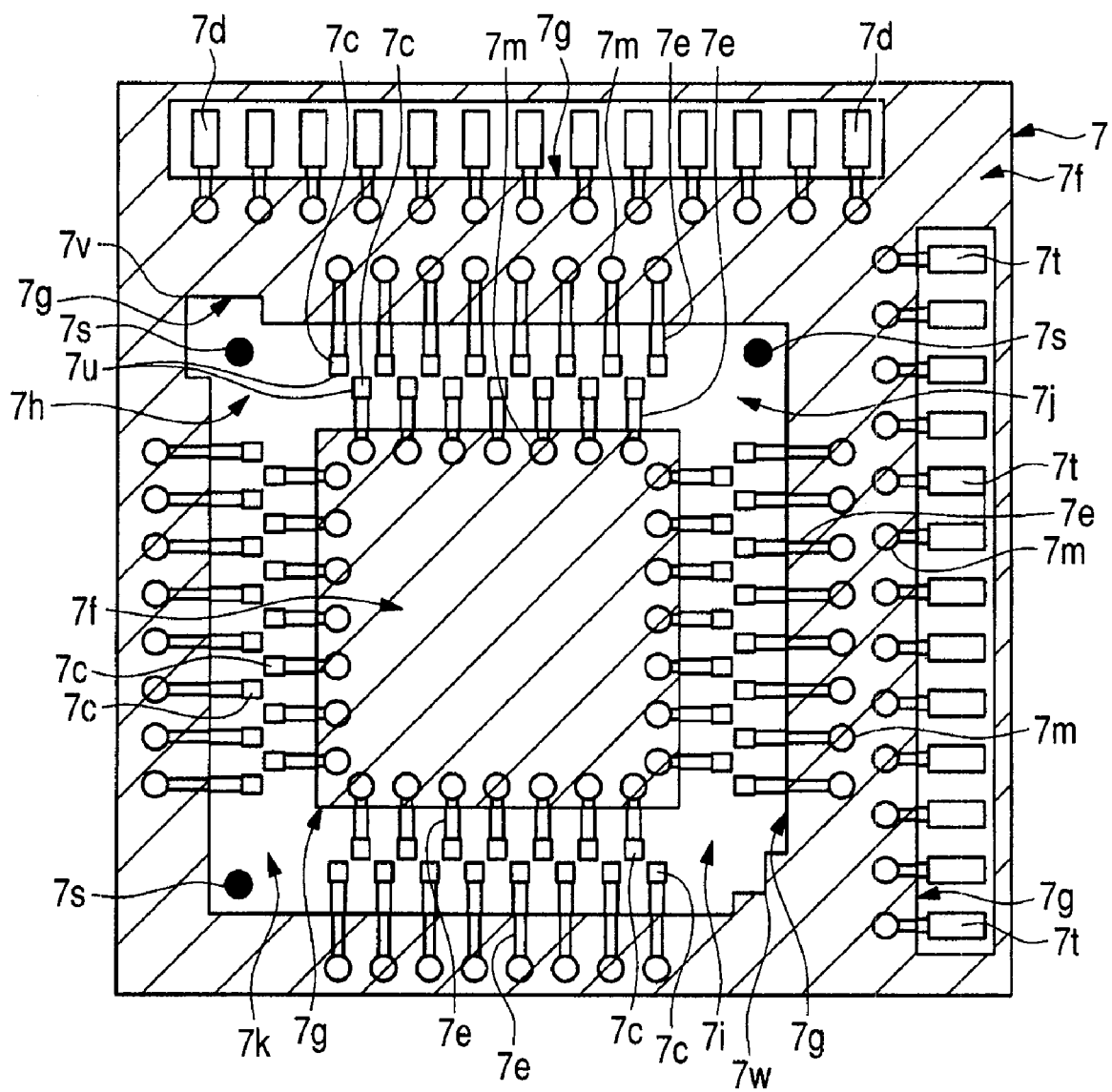
FIG. 17 is a plan view showing an example of a substrate structure incorporated in the semiconductor device shown in FIG. 15.
Figure 18:
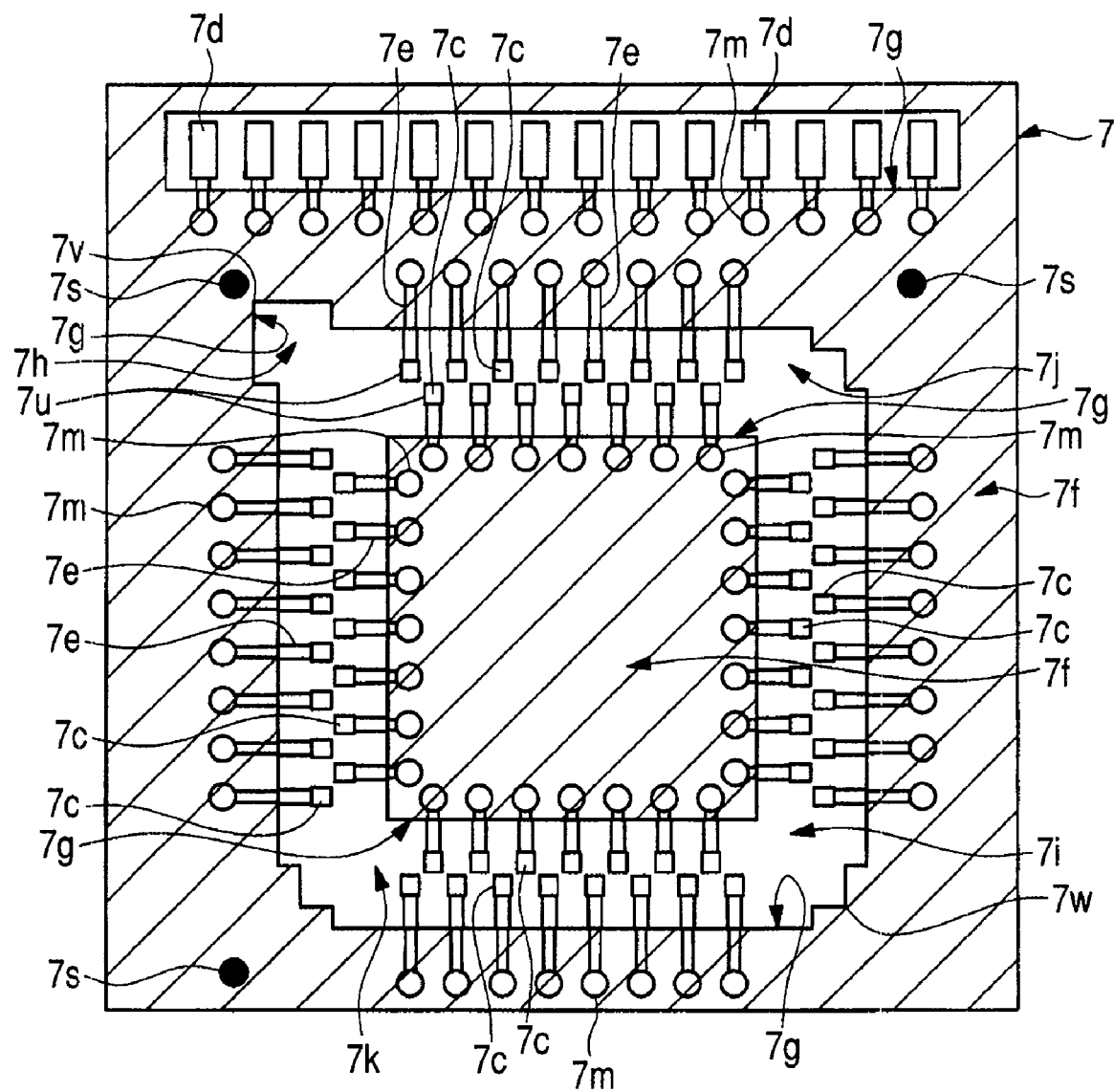
FIG. 18 is a plan view showing an example of a substrate structure incorporated in a semiconductor device in a second modified example of the first embodiment.

FIG. 15 is a sectional view showing the structure taken in the direction of a wire ring of a memory chip on an upper stage of a semiconductor device in the first modified example of the first embodiment of the invention. FIG. 16 is a sectional view showing the structure taken in the direction of the wire ring of a memory chip on a lower stage shown in FIG. 15. FIG. 17 is a plan view showing an example of a substrate structure incorporated in the semiconductor device shown in FIG. 15. FIG. 18 is a plan view showing an example of a substrate structure incorporated in a semiconductor device in a second modified example of the first embodiment of the invention.

The semiconductor device of the first modified example shown in FIGS. 15 and 16 is the SIP 14 having a three-stage chip laminated structure which includes the microcomputer chip 1 flip-chip bonded to the wiring board 7, the first memory chip 2 laminated on the microcomputer chip 1, and a second memory chip 3 laminated on the first memory chip 2.

The SIP 14 has the same structure as that of the SIP 8 in the flip-chip structure of the microcomputer chip 1 on the first stage and in the wire bonding structure of the first memory chip 2 on the second stage. The SIP 14 further includes the second memory chip 3 with the wire bonding structure laminated on the first memory chip 2 on the second stage of the SIP 8.

Thus, in the SIP 14, the microcomputer chip 1 on the first stage is flip-chip bonded facing down over the surface 7a of the wiring board 7. The first memory chip 2 on the second stage is mounted facing up on the microcomputer chip 1 and wire bonded to the wiring board 7. Further, the second memory chip 3 on the third stage is mounted facing up on the first memory chip 2, and wire bonded to the wiring board 7. That is, the main surface 2a of the first memory chip 2 on the second stage is coupled to the back surface 3b of the second memory chip 3 on the third stage, and a main surface 3a of the second memory chip 3 is directed upward. Thus, pads 3c formed on the main surface 3a are exposed upward. As a result, the second memory chip 3 also has the structure which can be wire bonded.

The first memory chip 2 on the second stage and the second memory chip 3 on the third stage are respectively mounted such that the direction of the wire ring at the wire bonding portion of the first memory chip 2 is different from that of the second memory chip 3 by 90 degrees. That is, as shown in FIG. 17, in the wiring board 7, one line of the terminals 7d for the wire bonding for the second-stage first memory chip 2 provided on the surface 7a, and one line of terminals 7t for the wire bonding for the third-stage second memory chip 3 are provided along the sides of the board that differ from each other by 90 degrees. In FIG. 17, the area enclosed by the hatched line is one covered with the solder resist film 7f.

Thus, the wire bonding can be performed such that the wire ring direction of the first memory chip 2 on the second stage in wire bonding differs from the wire ring direction at the wire bonding of the second memory chip 3 on the third stage in wire bonding by 90 degrees. Both of the first memory chip 2 on the second stage and the second memory chip 3 on the third stage can be wire bonded.

The corner of the second opening portion 7i of the solder resist film 7f on the surface 7a of the wiring board 7 of the SIP 14 is made close to the microcomputer chip 1 on the first stage. Thus, upon injecting the underfill material in assemble of the SIP 14, the underfill material 4 dropped from the nozzle 12 easily wets and spreads along the side wall of the microcomputer chip 1 by narrowing the second opening portion 7i on the air vent side.

Thus, the exposure of the lead to the second opening portion 7i can be reduced, thereby improving the reliability of the SIP 14 like the SIP 8.

Then, in the second modified example shown in FIG. 18, target marks 7s for identification are formed in the wiring board 7 outside the opening 7g of the solder resist film 7f. The marks 7s are formed outside three corners of the rectangular ring-like opening 7g. Any two or more marks may be formed outside the opening 7g. In FIG. 18, the area indicated by the hatched line is one covered with the solder resist film 7f.

The formation of the target marks 7s outside the opening 7g can narrow the opening 7g so as to make some of corners of the opening 7g close to the microcomputer chip 1 (see FIG. 1). In the second modified example in FIG. 18, a distance from the corner of each of three portions of the opening 7g except for the first opening portion 7h on the underfill material injection side to the corresponding corner of the microcomputer chip 1 is shorter than that from the corner of the first opening portion 7h to the corresponding corner of the chip 1, among the four portions of the opening 7g of the solder resist film 7f of the wiring board 7 corresponding to four corners of the microcomputer chip 1.

That is, among four portions of the opening 7g formed in the rectangular ring-like shape, the corner of each of three portions of the opening 7g (the second opening portion 7i, the third opening portion 7j, and the fourth opening portion 7k) is made small so as to be brought close to the corresponding corner of the microcomputer chip 1, which can improve the wettability and spread of the underfill material 4 at each corner of the opening 7g.

Thus, the exposure of the leads to three portions of the opening 7g (the second opening portion 7i, the third opening portion 7j, and the fourth opening portion 7k) can be reduced, which can further improve the reliability of the semiconductor device.

Second Embodiment

Figure 19:
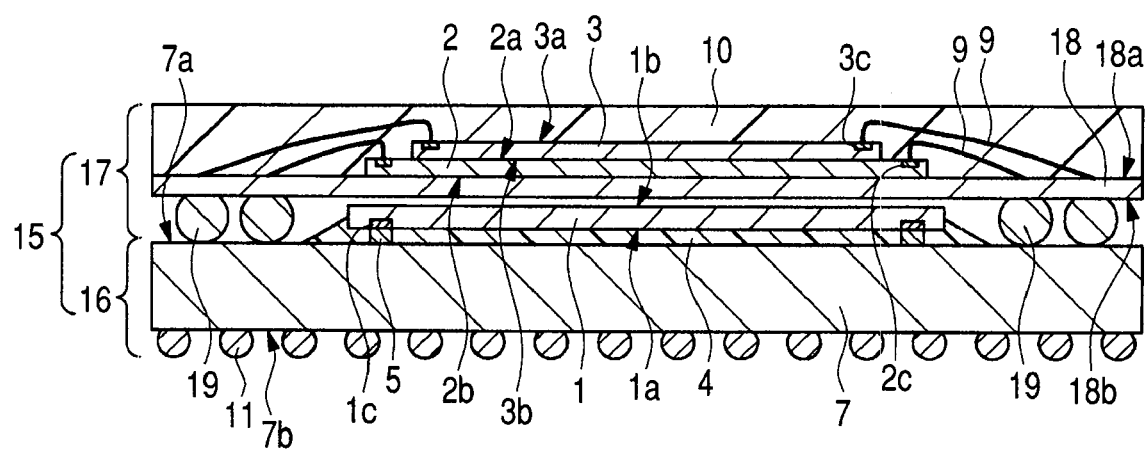
FIG. 19 is a sectional view showing an example of the substrate structure according to a second embodiment of the invention.
Figure 20:
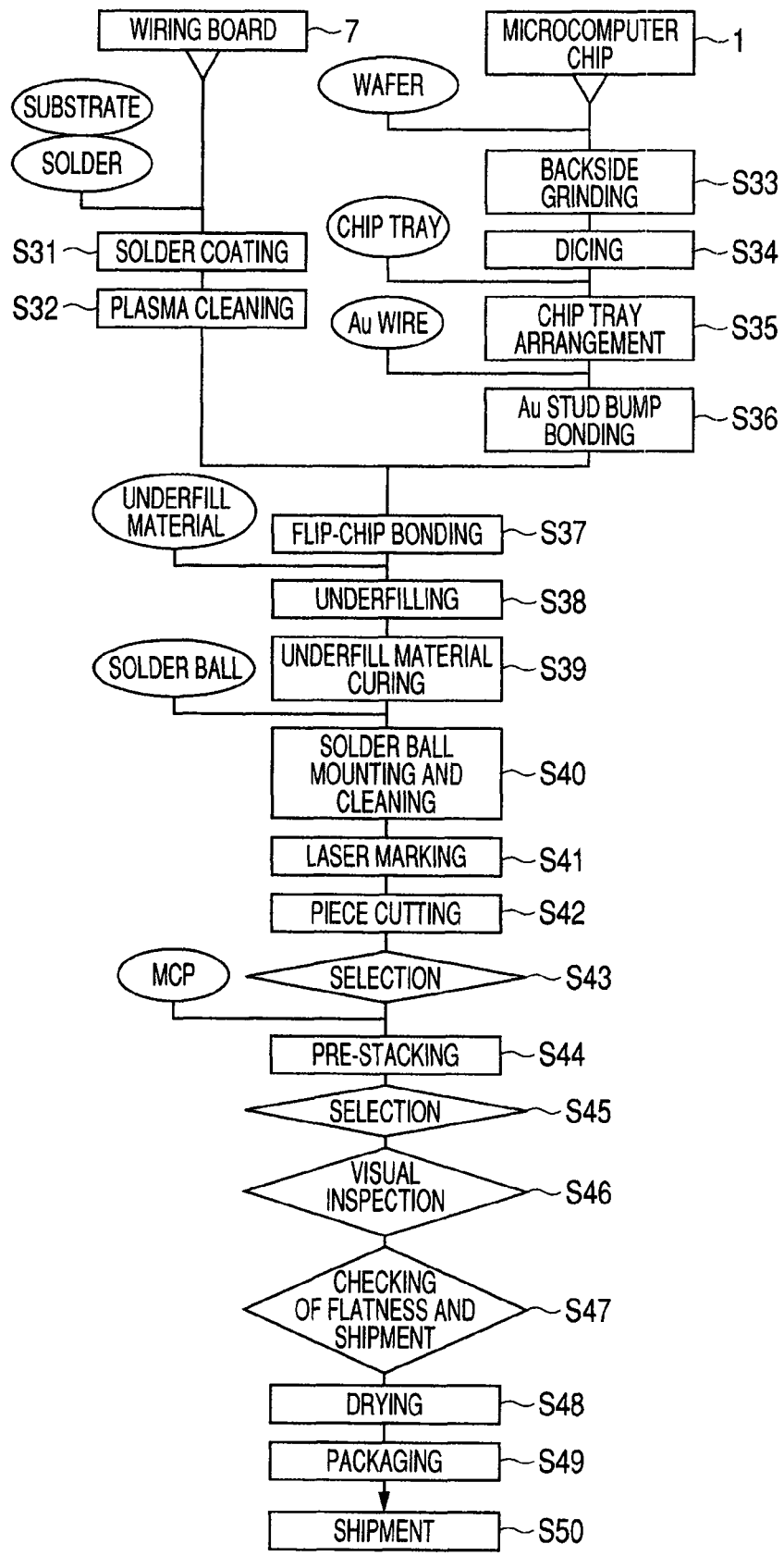
FIG. 20 is a flowchart showing an example of an assembly procedure of the semiconductor device shown in FIG. 19.
Figure 21:
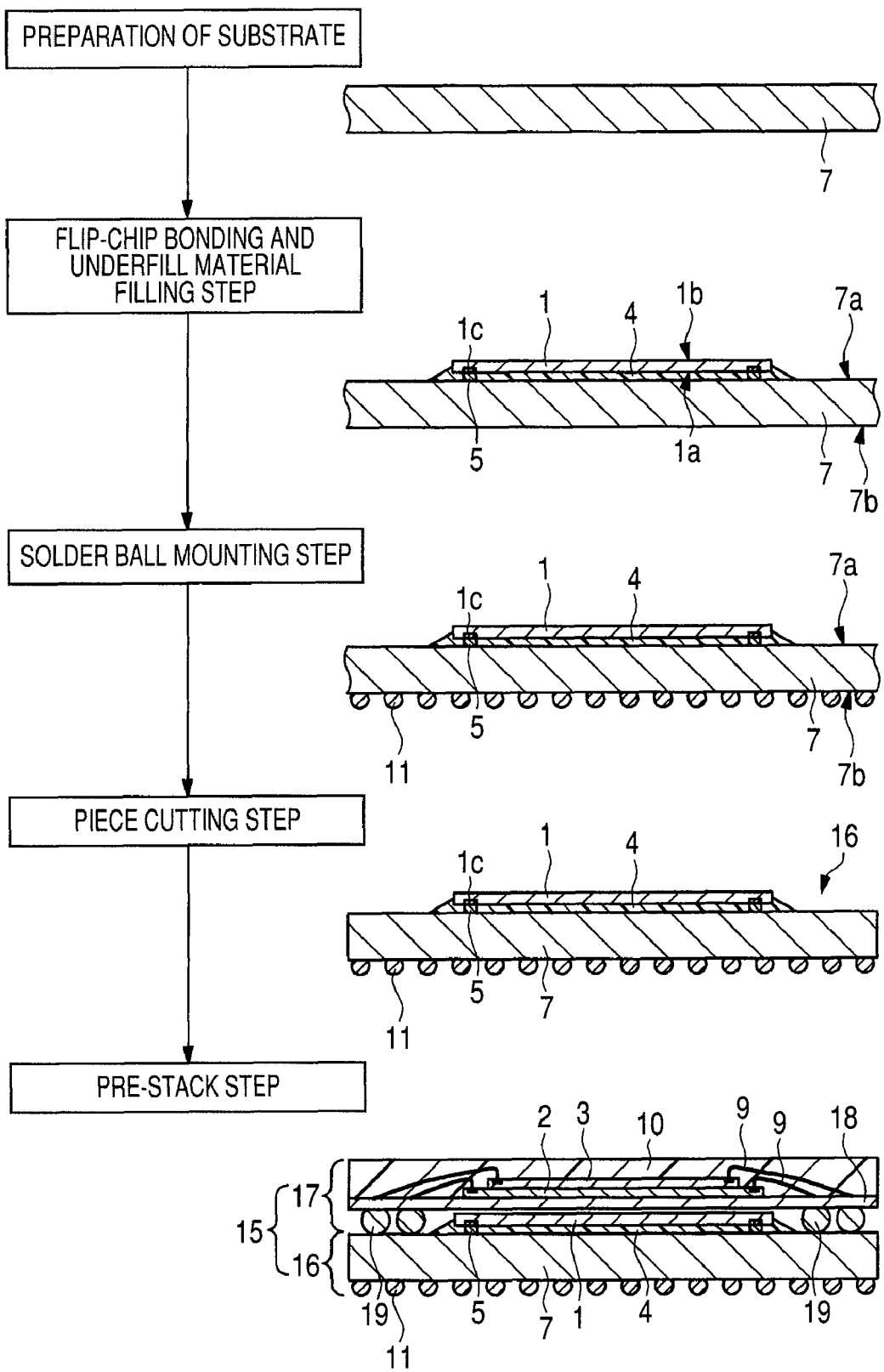
FIG. 21 is a process flowchart showing an example of main steps in the assembly procedure shown in FIG. 20.
Figure 22:
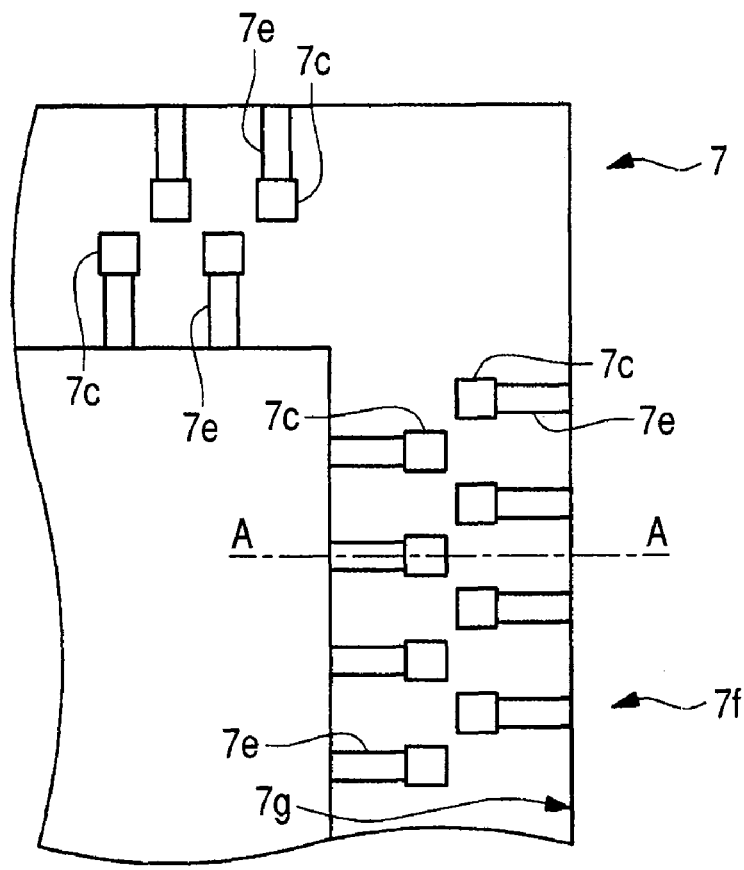
FIG. 22 is a partial enlarged plan view showing arrangement of bonding leads at a substrate in a comparative example.
Figure 23:
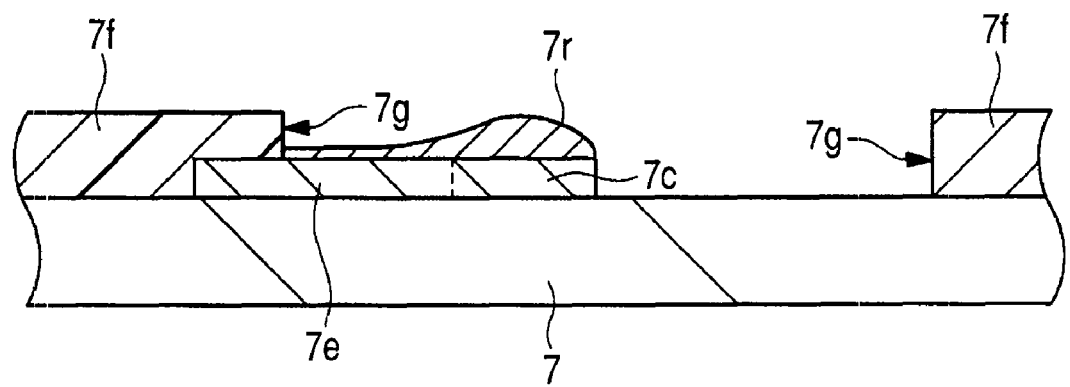
FIG. 23 is a partial enlarged sectional view showing an example of the structure taken along the line A-A of FIG. 22.

FIG. 19 is a sectional view showing an example of the structure of a semiconductor device according to a second embodiment of the invention. FIG. 20 is a flowchart showing an example of an assembly procedure of the semiconductor device shown in FIG. 19. FIG. 21 is a process flowchart showing an example of main steps in the assembly procedure shown in FIG. 20.

The semiconductor device of the second embodiment shown in FIG. 19 includes the microcomputer chip 1 flip-chip bonded to the wiring board 7, like the SIP 8 described in the first embodiment. The semiconductor device is a system-in-package type semiconductor device called as "package on package (POP) 15" in which another package with memory chips is mounted on a first package 16 having the wiring board 7 with the microcomputer chip 1 flip-chip bonded thereover.

The detailed structure of the POP 15 will be described below. The POP 15 includes the first package 16 on the lower stage having the microcomputer chip 1 flip-chip bonded to the wiring board 7, and a multi-chip package 17 on the upper stage mounted on the first package 16, and having the first memory chip 2 and the second memory chip 3 laminated on the first memory chip 2.

The first package 16 includes the wiring board 7, the microcomputer chip 1 flip-chip bonded to the surface 7a of the wiring board 7 via the gold bumps 5, the underfill material 4 with which a flip-chip bonding portion between the board 7 and the chip 1 is filled, and solder balls 11 serving as external terminals of the POP 15 provided on the back surface 7b of the board 7.

On the other hand, the multi-chip package 17 includes a package substrate 18 made of a film base or the like, the first memory chip 2 mounted facing up on a surface 18a of the package substrate 18, the second memory chip 3 mounted facing up on the first memory chip 2, the wires 9 for electrically coupling the first and second memory chips 2 and 3 to the package substrate 18, and the sealing member 10 for sealing the respective memory chips and the wires 9 with resin. Further, MCP ball electrodes 19 are provided as the external terminal of the multi-chip package 17 on the back surface 18b of the package substrate 18. The MCP ball electrodes 19 are also electrically coupled to the wiring board 7 of the first package 16 on the lower stage.

That is, the MCP ball electrodes 19 each serve as the external terminal of the multi-chip package 17 on the upper stage, and also as a terminal for electrically coupling the first package 16 on the lower stage to the multi-chip package 17 on the upper stage.

In the POP 15, the first package 16 and the multi-package 17 are respectively assembled independently, and good products of the packages are separated from bad ones. The good products of these respective packages are combined together, which can advantageously improve the yield of the POP 15.

Also in the wiring board 7 of the first package 16 on the lower stage of the POP 15, the corner of the second opening portion 7i of the solder resist film 7f is made close to the microcomputer chip 1 like the wiring board 7 of the SIP 8 of the first embodiment shown in FIG. 1, thereby narrowing the opening degree of the second opening portion 7i on the air vent side. Thus, the wettability and spread of the underfill material 4 at the second opening portion 7i can be improved thereby to reduce the exposure of the leads to the second opening portion 7i.

As a result, the reliability of the POP 15 can be improved.

Next, the assembly procedure of the semiconductor device (POP 15) of the second embodiment will be described below with reference to the flowchart in FIG. 20.

First, solder coating is applied to form the wiring board 7 of the first package 16 on the lower stage in step S31 shown in FIG. 20. In the wiring board 7 of the first package 16, like the wiring board 7 shown in FIG. 1, the bonding leads 7c for the flip-chip bonding to be exposed to the opening 7g of the solder resist film 7f of the surface 7a need to be arranged in the staggered manner with a small pitch and respectively formed in the cantilever lead form. Further, the thick solder layer 7r needs to be formed on the bonding lead 7c as shown in FIG. 7. Thus, an adhesive liquid coat is formed over copper material for forming the bonding lead 7c, and solder powder (solder particle) is applied thereon. Thus, flux is applied to the solder powder, and subjected to reflow soldering to melt the solder power, which forms the solder layer (solder precoat) 7r on the bonding leads 7c. This method is preferably used.

Accordingly, in the wiring board 7, since the respective bonding leads 7c for the flip-chip bonding shown in FIG. 1 are arranged in the cantilever lead form in the opening 7g of the solder resist film 7f, the opening 7g of the solder resist film 7f is widely formed so as to have a wide width. The opening 7g is formed in the solder resist film 7f in the rectangular ring-like shape along the outer peripheral shape of the microcomputer chip 1 mounted. As shown in FIG. 4, the bonding leads 7c for the flip-chip bonding are arranged in the opening 7g in the staggered manner with a small pitch, and in the cantilever lead form. In the opening 7g of the solder resist film 7f corresponding to four corners of the microcomputer chip 1 mounted, the second opening portion 7i of the solder resist film 7f corresponding to the corner on the air vent side of the microcomputer chip 1 is made narrower by bringing the corner of the second opening portion 7i closer to the microcomputer chip 1 than the first opening portion 7h on the underfill material injection side.

In other words, in the opening 7g of the solder resist film 7f formed along the outer peripheral shape of the microcomputer chip 1 mounted, only the first opening portion 7h on the underfill material injection side at the corner is formed widely as compared to other opening portions. That is, as shown in FIG. 4, the opening 7g of the solder resist film 7f in an area with the bonding leads 7c arranged therein is formed to have a certain width at the four sides. That is, if the area of the opening 7g with the bonding leads 7c arranged therein is formed more widely than other areas, the amount of coating of the solder material on the bonding leads 7c may become nonuniform in forming the solder layer 7r. For this reason, the width of the opening 7g in the area with the bonding leads 7c arranged therein is made constant. Accordingly, the width of the opening 7g in the area with the bonding leads 7c arranged therein is made constant, which can provide the certain amount of supply of solder material to the respective bonding leads 7c.

After the solder coating process, plasma cleaning is performed to clean the wiring board 7 in step S32 shown in FIG. 20.

On the other hand, a wafer for the microcomputer chip is supplied and backside grinding is performed so as to form the microcomputer chip 1 in step S33. That is, the back surface of the wafer is polished until the wafer has a predetermined thickness. Then, dicing is performed in step S34 to obtain the microcomputer chips 1.

Further, a chip tray is supplied, and an arrangement process using the chip tray is performed in step S35. At this time, the microcomputer chips 1 obtained by the dicing process are accommodated in the chip tray.

Then, an Au wire is supplied to perform Au stud bump bonding in step S36. At this time, the use of the Au wire forms the Au bumps 5 on the pads 1c on the main surface 1a of each microcomputer chip 1.

Thereafter, the wiring board 7 having the same structure as that shown in FIG. 4 is prepared by a substrate preparation step shown in FIG. 21 thereby to assemble the SIP 15.

First, flip-chip bonding is performed in step S37 shown in FIG. 20. That is, a flip-chip bonding underfill material filling step is performed as shown in FIG. 21. Like the first embodiment, as shown in FIG. 11, the bonding lead 7c of the wiring board 7 is coupled to the microcomputer chip 1 via the gold bump 5, so that the microcomputer chip 1 is flip-chip bonded to the wiring board 7. At that time, the gold bump 5 on the microcomputer chip 1 and the solder layer 7r on the bonding lead 7c of the wiring board 7 are coupled to each other by thermal compression. Since the solder layer 7r is formed thick on the bonding lead 7c, the coupling strength between the gold bump 5 and the solder can be ensured.

After the completion of the flip-chip bonding, the microcomputer chip 1 is mounted over the surface 7a of the wiring board 7 with its back surface 1b directed upward as shown in FIG. 11.

Then, an underfill process is performed in step S38 as shown in FIG. 20. An underfill material 4 is dropped in the first opening portion 7h on the injection side of the underfill material 4 corresponding to the corner of the microcomputer chip 1, and a gap between the wiring board 7 and the microcomputer chip 1 is filled with the underfill material 4. That is, as shown in FIG. 14, the underfill material 4 is dropped from the above via the nozzle 12 into the first opening portion 7h on the injection side of the underfill material 4 corresponding to the corner of the microcomputer chip 1. In this way, the underfill material 4 penetrates from one corner corresponding to the first opening portion 7h of the microcomputer chip 1 through the gap between the microcomputer chip 1 and the wiring board 7. That is, the underfill material 4 penetrates not from the corners of the microcomputer chip 1, but from only one corner thereof, which can make it difficult to form voids.

Now, the underfill material 4 is charged in the same way as in the first embodiment.

Thus, the gap between the wiring board 7 and the microcomputer chip 1 can be filled with the underfill material 4, while suppressing the formation of the voids as shown in the flip-chip bonding and underfill material filling steps in FIG. 21, and also in FIG. 12.

According to the assembly of the semiconductor device of the second embodiment, like the first embodiment, in the second opening portion 7i of the solder resist film 7f of the wiring board 7 corresponding to the corner of the microcomputer chip 1 on the air vent side in injection of the underfill material, the corner of the second opening portion 7i of the solder resist film 7f is made close to the microcomputer chip 1. Thus, the wettability and spread of the underfill material 4 at the second opening portion 7i corresponding to the corner of the microcomputer chip 1 can be improved.

That is, the corner of the second opening portion 7i of the solder resist film 7f is made close to the microcomputer chip 1, which facilitates wetting and spreading of the underfill material 4 dropped from the nozzle 12 along the side wall of the microcomputer chip 1 by narrowing the second opening portion 7i on the air vent side.

Thus, the exposure of the lead to the second opening portion 7i can be reduced, which can improve the reliability of the first package 16 on the lower stage, as well as the reliability of the POP 15.

After filling with the underfill material 4, the underfill material is cured in step S39 shown in FIG. 20. That is, the underfill material 4 charged is heated and cured at a predetermined temperature.

Thereafter, solder balls are supplied, and the balls are mounted and cleaned in step S40 shown in FIG. 20. In the ball bonding step shown in FIG. 21, solder balls 11 serving as external terminals are provided on the back surface 7b of the wiring board 7, for example, in a lattice-like arrangement, and cleaned by flux cleaning and the like.

Then, laser marking is performed in step S41 shown in FIG. 20 thereby to put a mark about desired information, for example, on the surface or the like of the wiring board 7.

Then, piece cutting is performed in step S42 shown in FIG. 20. In the piece cutting step shown in FIG. 21, the wiring board 7 is cut into packages.

Thereafter, good products of the first packages 16 are separated from bad products thereof by the selection process in step S43 shown in FIG. 20.

Then, the good product of the multi-chip package 17 to be mounted on the upper stage is supplied, and pre-stacking is carried out in step S44 shown in FIG. 20. That is, in the pre-stack step shown in FIG. 21, the good product of the multi-chip package 17 is mounted on the good product of the first package 16 selected to complete the POP 15.

Then, the good products of the POPs 15 are separated in the selection process in step S45 shown in FIG. 20. The outer appearance of the POP 15 is checked by the outer appearance checking process in step S46.

Thereafter, flatness and shipment is checked in step S47, drying is performed in step S48, packaging is performed in step S49, and finally the product is shipped in step S50.

Although the invention made by the inventors has been specifically described above based on the exemplary embodiments, it will be understood by those skilled in the art that the invention is not limited thereto, and that various modifications can be made without departing from the spirit and scope of the invention.

For example, in the description of the first embodiment, when distances from the four corners of the opening $7g$ to the respective corners of the microcomputer chip 1 in the wiring board 7 are indicated by M from the first opening portion $7h$, L from the second opening portion $7i$, N from the third opening portion $7j$, and also N from the four opening portion $7k$, the following relationship is satisfied: L<N<M (at the distance from the first opening portion $7h$=M, the distance from the second opening portion $7i$=L, and the distance from the third opening portion $7j$=N, the distance from the fourth opening portion $7k$=N). The shape of the second opening portion $7i$ on the air vent side may have the same as that of the third opening portion $7j$ or the fourth opening portion $7k$. That is, the following relationship may be satisfied: the distance from the second opening portion $7i$=N, the distance from the second opening portion $7i$=the distance from the third opening portion $7j$=the distance from the fourth opening portion $7k$=N<the distance from the first opening portion $7h$=M. Also, in this case, this arrangement can improve the wettability and spread of the underfill material 4 at the second opening portion $7i$ on the air vent side.

The invention is suitable for use in an electronic device employing application of underfill material.

What is claimed is:

1. A manufacturing method for a semiconductor device, comprising the steps of:
   (a) preparing a substrate including a plurality of bonding leads, and having an insulating film formed over a surface thereof, the bonding leads being exposed to an opening of the insulating film;
   (b) mounting a semiconductor chip having a rectangular planar shape, and including a main surface with a plurality of pads formed thereover, and a back surface opposite to the main surface, over the bonding leads of the substrate via protruding electrodes formed over the pads such that the main surface is opposed to the surface of the substrate;
   (c) filling a gap between the substrate and the semiconductor chip with underfill material; and
   (d) providing a plurality of external terminals at the back surface of the substrate for being coupled to an external portion,
   wherein the opening of the insulating film of the substrate is formed along an outer peripheral shape of the semiconductor chip, and includes a first opening portion corresponding to a corner of the semiconductor chip, and a second opening portion opposed to the first opening portion,
   wherein a plurality of through holes to be coupled to the external terminals are arranged outside the opening,
   wherein the bonding lead includes a lead wire derived from the through hole into the opening, and a mounting portion over which the protruding electrode is mounted,
   wherein the bonding lead derived in a direction from an outside of a side of the substrate into the opening, and the bonding lead derived in a direction from a center of the semiconductor chip into the opening are alternately arranged in the opening,
   wherein the opening of the substrate is formed in a rectangular shape having a planar shape with four corners,
   wherein the first opening portion has a first corner of the four corners, and the second opening portion has a second corner thereof, and
   wherein a distance between the second corner and a corner of the semiconductor chip adjacent thereto is shorter than that between the first corner and a corner of the semiconductor chip adjacent thereto, and
   wherein in the step (c), the underfill material is dropped from the first opening, so that the gap between the substrate and the semiconductor chip is filled with the underfill material.

2. The manufacturing method for the semiconductor device according to claim 1,
   wherein the opening has a first side and a second side, and
   wherein the second corner is an intersection point of a third side positioned between the first side and an outer periphery of the chip and leading to the first side, and a fourth side positioned between the second side and an outer periphery of the chip and leading to the second side.

3. The manufacturing method for the semiconductor device according to claim 2,
   wherein the second corner is positioned along a diagonal line connecting a center of the semiconductor chip and the corresponding corner of the semiconductor chip.

4. The manufacturing method for the semiconductor device according to claim 1, wherein in the step (c), the underfill material is dropped from the first opening portion, while moving the nozzle along the side of the semiconductor chip, and the dropping of the underfill material is stopped before the underfill material reaches the corner of the same side of the semiconductor chip.

5. The manufacturing method for the semiconductor device according to claim 1, wherein the first opening portion is formed more widely than any other portion in the opening of the insulating film formed along the outer peripheral shape of the semiconductor chip.

6. The manufacturing method for the semiconductor device according to claim 1, wherein dummy leads not coupled to the through hole are provided at both ends of a bonding lead line of the substrate corresponding to one side of the semiconductor chip.

7. The manufacturing method for the semiconductor device according to claim 1, wherein a plurality of target marks for identification are formed in the opening of the insulating film of the substrate.

8. The manufacturing method for the semiconductor device according to claim 1, wherein a plurality of target marks for identification are formed outside the opening of the insulating film of the substrate.

9. The manufacturing method for the semiconductor device according to claim 8, wherein a distance between the first corner of the substrate and a corner of the semiconductor chip adjacent thereto is longer than that between each of three other corners of the substrate and the corner of the semiconductor chip adjacent thereto.

* * * * *